US010818541B2

(12) United States Patent
Chiu

(10) Patent No.: US 10,818,541 B2
(45) Date of Patent: Oct. 27, 2020

(54) SEMICONDUCTOR STRUCTURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/363,374

(22) Filed: Mar. 25, 2019

(65) Prior Publication Data

US 2020/0211893 A1 Jul. 2, 2020

Related U.S. Application Data

(60) Provisional application No. 62/785,397, filed on Dec. 27, 2018.

(51) Int. Cl.
| | |
|---|---|
| *H01L 21/764* | (2006.01) |
| *H01L 29/06* | (2006.01) |
| *H01L 21/3065* | (2006.01) |
| *H01L 21/3105* | (2006.01) |
| *H01L 21/02* | (2006.01) |
| *H01L 21/311* | (2006.01) |

(52) U.S. Cl.
CPC ...... *H01L 21/764* (2013.01); *H01L 21/02164* (2013.01); *H01L 21/02532* (2013.01); *H01L 21/3065* (2013.01); *H01L 21/31051* (2013.01); *H01L 21/31111* (2013.01); *H01L 29/0649* (2013.01)

(58) Field of Classification Search
CPC .......................... H01L 21/764; H01L 29/0649
See application file for complete search history.

(56) References Cited

U.S. PATENT DOCUMENTS

2005/0059245 A1 3/2005 Spencer et al.
2015/0333011 A1* 11/2015 Ting .................. H01L 23/53223
257/751

FOREIGN PATENT DOCUMENTS

| CN | 1501492 A | 6/2004 |
|---|---|---|
| TW | I527153 B | 3/2016 |
| TW | I579998 B | 4/2017 |
| TW | I636551 B | 9/2018 |

OTHER PUBLICATIONS

Office Action dated Apr. 1, 2020 related to Taiwanese Application No. 108126681.

* cited by examiner

*Primary Examiner* — Jay C Chang
*Assistant Examiner* — Mikka Liu
(74) *Attorney, Agent, or Firm* — Muncy, Geissler, Olds & Lowe, P.C.

(57) ABSTRACT

The present disclosure provides a semiconductor structure and a method of manufacturing the same. The semiconductor structure includes a semiconductor substrate, an air gap region, a capping layer, and an isolating layer. The air gap region is disposed in the semiconductor substrate. The capping layer is disposed on the air gap region. The isolating layer is disposed on the semiconductor substrate and partially encircles the capping layer.

8 Claims, 30 Drawing Sheets

SEMICONDUCTOR STRUCTURE

PRIORITY CLAIM AND CROSS-REFERENCE

This application claims the priority benefit of U.S. provisional application Ser. No. 62/785,397, filed on Dec. 27, 2018. The entirety of the above-mentioned patent application is hereby incorporated by reference herein and made a part of this specification.

TECHNICAL FIELD

The present disclosure relates to a semiconductor structure and a method of manufacturing the same, and more particularly, to a semiconductor structure having an air gap region and a method of manufacturing the same.

DISCUSSION OF THE BACKGROUND

Two-dimensional (2D) approaches have been traditionally applied for IC integration. Continuous demand for new IC packages that can fulfill the consumer market requirements for increased functionality and performance with reduced size and cost has driven the semiconductor industry to develop more innovative packaging, using vertical, three-dimensional (3D) integration.

General advantages of 3D packaging technologies include form factor miniaturization (reduction of size and weight), integration of heterogeneous technologies in a single package, replacement of lengthy 2D interconnects with short vertical interconnects, and the reduction of power consumption.

In general, a 3D packaging semiconductor device includes dielectric materials formed between adjacent conductive structures. As the degree of integration of semiconductor devices is increased, the distance between conductive structures becomes smaller. As a result, parasitic capacitance is increased. An increase in parasitic capacitance may reduce the performance of the semiconductor device.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a semiconductor substrate, an air gap region, a capping layer, and an isolating layer. The air gap region is in the semiconductor substrate. The capping layer is disposed on the air gap region. The isolating layer is disposed in the semiconductor substrate and partially encircles the capping layer.

In some embodiments, the air gap region has a diameter that gradually decreases at positions of increasing distance from the capping layer.

In some embodiments, a portion of the capping layer is in contact with the semiconductor substrate.

In some embodiments, the semiconductor substrate is defined with a bottom portion, an upper portion where the capping layer is disposed, and a middle portion sandwiched between the bottom portion and the upper portion, wherein a top boundary of the air gap region, where the capping layer is not in contact with the semiconductor substrate, is higher than an interface between the upper portion and the middle portion.

In some embodiments, the isolating layer is connected to the capping layer on opposite sides of the capping layer.

In some embodiments, the isolating layer has a uniform width when viewed in a plan view.

In some embodiments, the capping layer includes a peripheral surface, wherein an area of a portion of the peripheral surface interfacing with the isolating layer is substantially greater than an area of a portion of the peripheral surface interfacing with the semiconductor substrate.

Another aspect of the present disclosure provides a method of manufacturing a semiconductor structure. The method includes steps of providing a semiconductor substrate; forming a stepped opening in the semiconductor substrate; depositing a sacrificial material in the stepped opening, wherein a portion of the semiconductor substrate is exposed through the sacrificial material; depositing a capping layer on the sacrificial material and the semiconductor substrate; removing the sacrificial material; and depositing an isolating layer to partially fill the stepped opening.

In some embodiments, the forming of the stepped opening includes steps of performing a first etching process to form an initial opening in the semiconductor substrate; and performing a second etching process to remove a portion of the semiconductor substrate connected to a front surface and encircling the initial opening.

In some embodiments, the method further includes a step of removing a portion of the semiconductor substrate beneath the initial opening during the removal of the portion of the semiconductor substrate connected to the front surface and encircling the initial opening.

In some embodiments, an angle between the front surface and an inner wall adjacent to the front surface is in a range between 85 and 90 degrees.

In some embodiments, the stepped opening comprises a first opening connected to the front surface of the semiconductor substrate and a second opening communicating with the first opening. In such embodiments, the deposition of the sacrificial material in the stepped opening includes steps of depositing a sacrificial material to fill the first opening and the second opening, and performing a third etching process to remove a portion of the sacrificial material from the first opening to expose the semiconductor substrate through the sacrificial material.

In some embodiments, the portions of the sacrificial material that are removed are removed from two opposite sides of the capping layer.

In some embodiments, the first opening has a uniform diameter, and the second opening has a diameter that gradually decreases at positions of increasing distance from the first opening.

In some embodiments, the deposition of the capping layer on the sacrificial material and the semiconductor substrate includes steps of depositing the capping layer to cover the sacrificial material and the semiconductor substrate, and performing a planarization process to remove portions of the sacrificial material and the capping layer above the front surface.

In some embodiments, hydrofluoric acid is employed to remove the sacrificial material.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
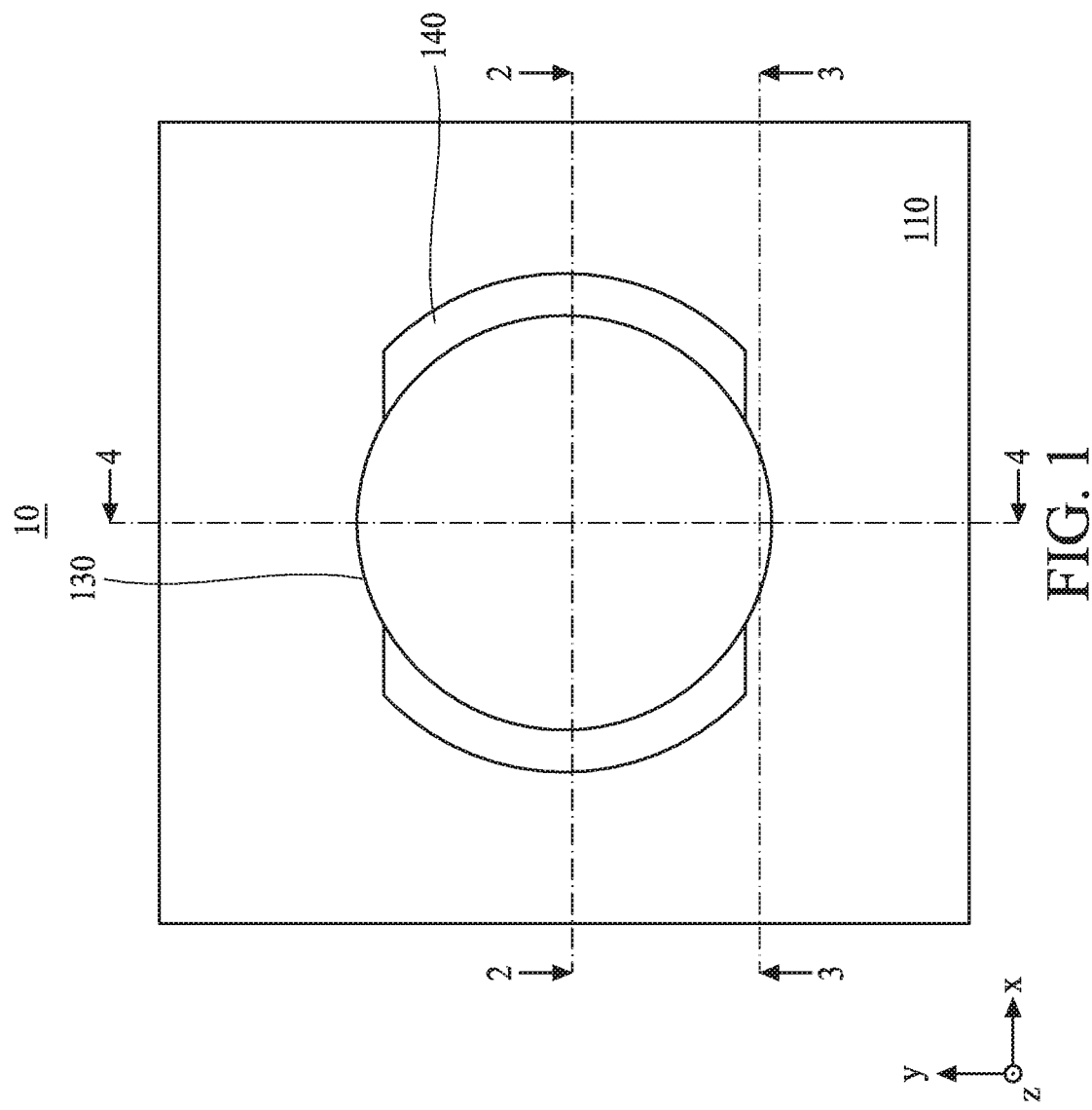
FIG. 1 is a top view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
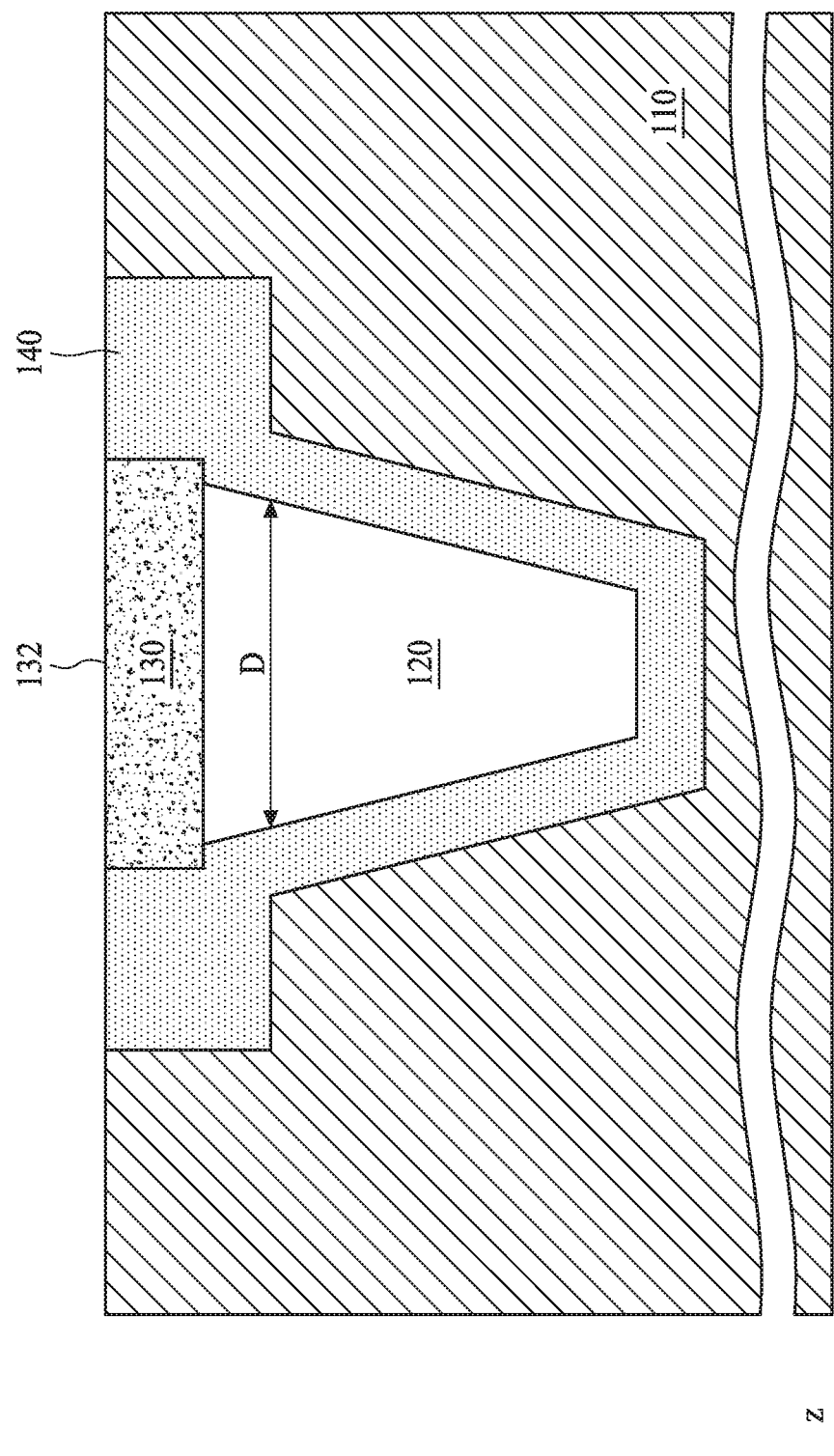
FIG. 2 is a cross-sectional view taken along the line 2-2 illustrated in FIG. 1.
Figure 3:
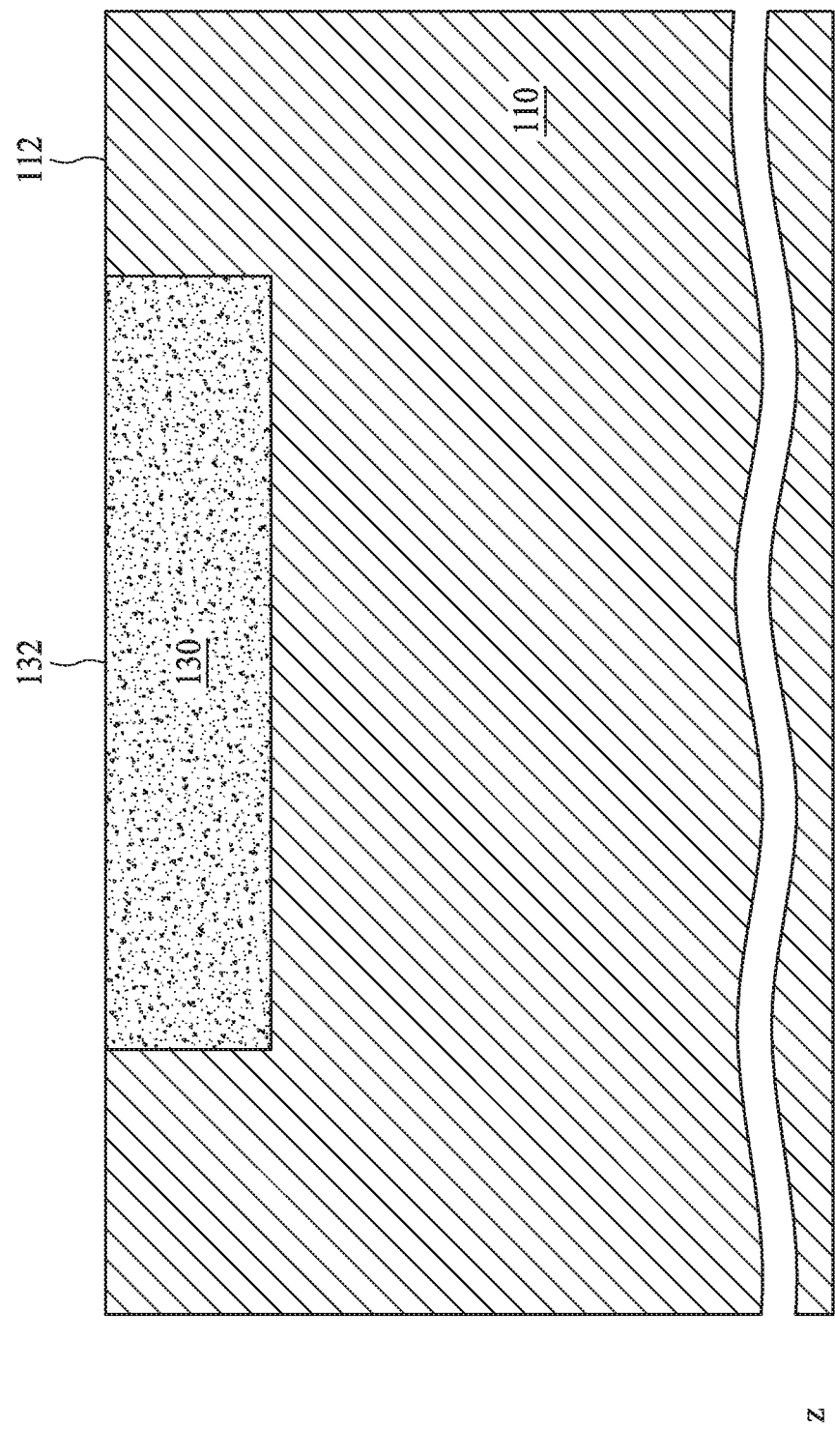
FIG. 3 is a cross-sectional view taken along the line 3-3 illustrated in FIG. 1.
Figure 4:
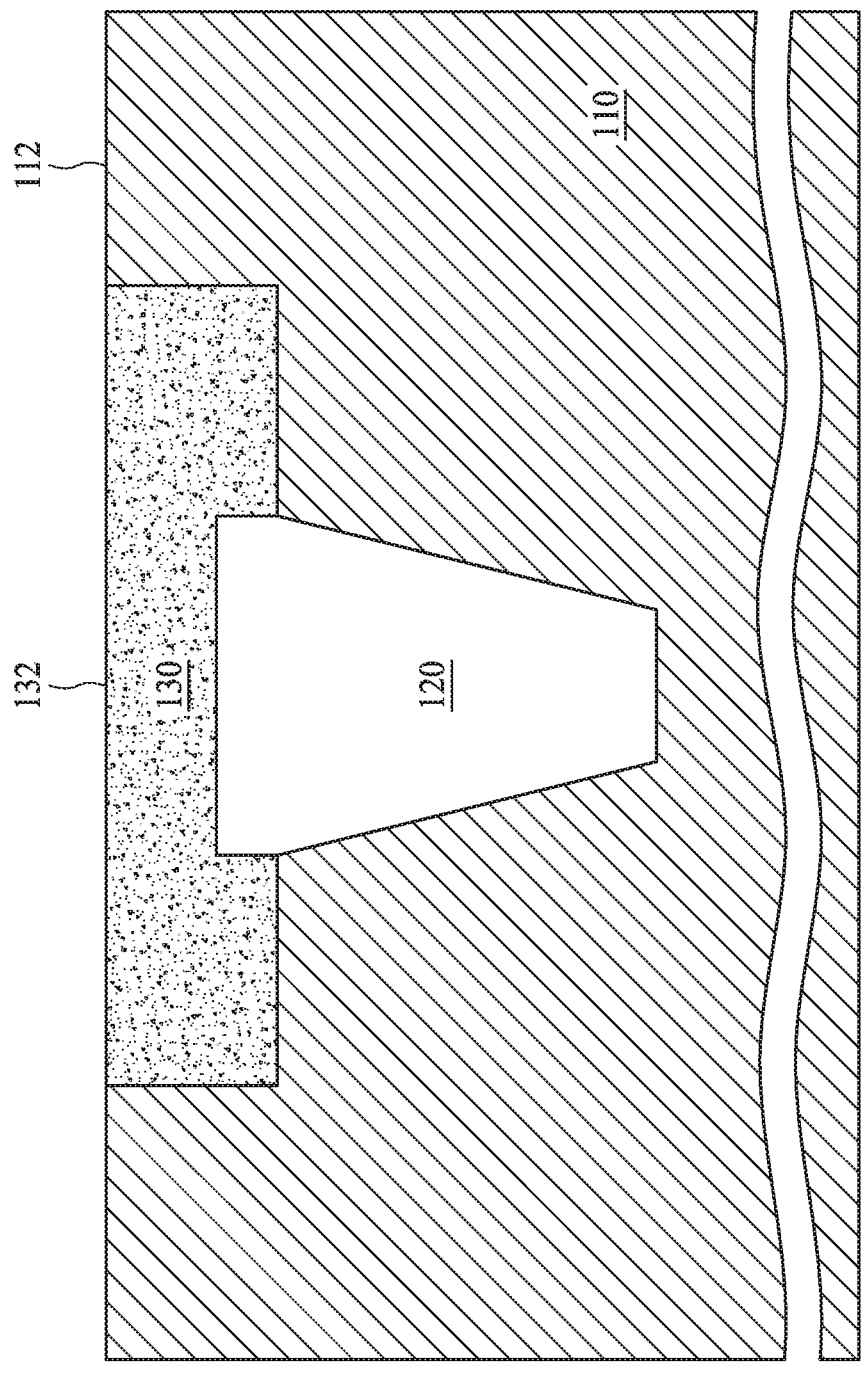
FIG. 4 is a cross-sectional view taken along the line 4-4 illustrated in FIG. 1.

FIG. 1 is a top view of a semiconductor structure 10 in accordance with some embodiments of the present disclosure, and FIGS. 2 to 4 are cross-sectional views of the semiconductor structure 10 in accordance with some embodiments of the present disclosure. Referring to FIGS. 1 to 4, the semiconductor structure 10 includes a semiconductor substrate 110, an air gap region 120 disposed in the semiconductor substrate 110, a capping layer 130 disposed on the air gap region 120, and an isolating layer 140 disposed in the semiconductor substrate 110 and partially encircling the capping layer 130.

In some embodiments, the air gap region 120 includes a diameter D, which gradually decreases at positions of increasing distance from the capping layer 130. In some embodiments, the isolating layer 140 extends into the air gap region 120. In some embodiments, portions of the capping layer 130 are in contact with the semiconductor substrate 110. In some embodiments, the capping layer 130 includes a top surface 132, which is coplanar with a front surface 112 of the semiconductor substrate 110. In some embodiments, the capping layer 130 includes polysilicon. In some embodiments, the isolating layer 140 includes oxide, such as silicon dioxide.

Figure 5:
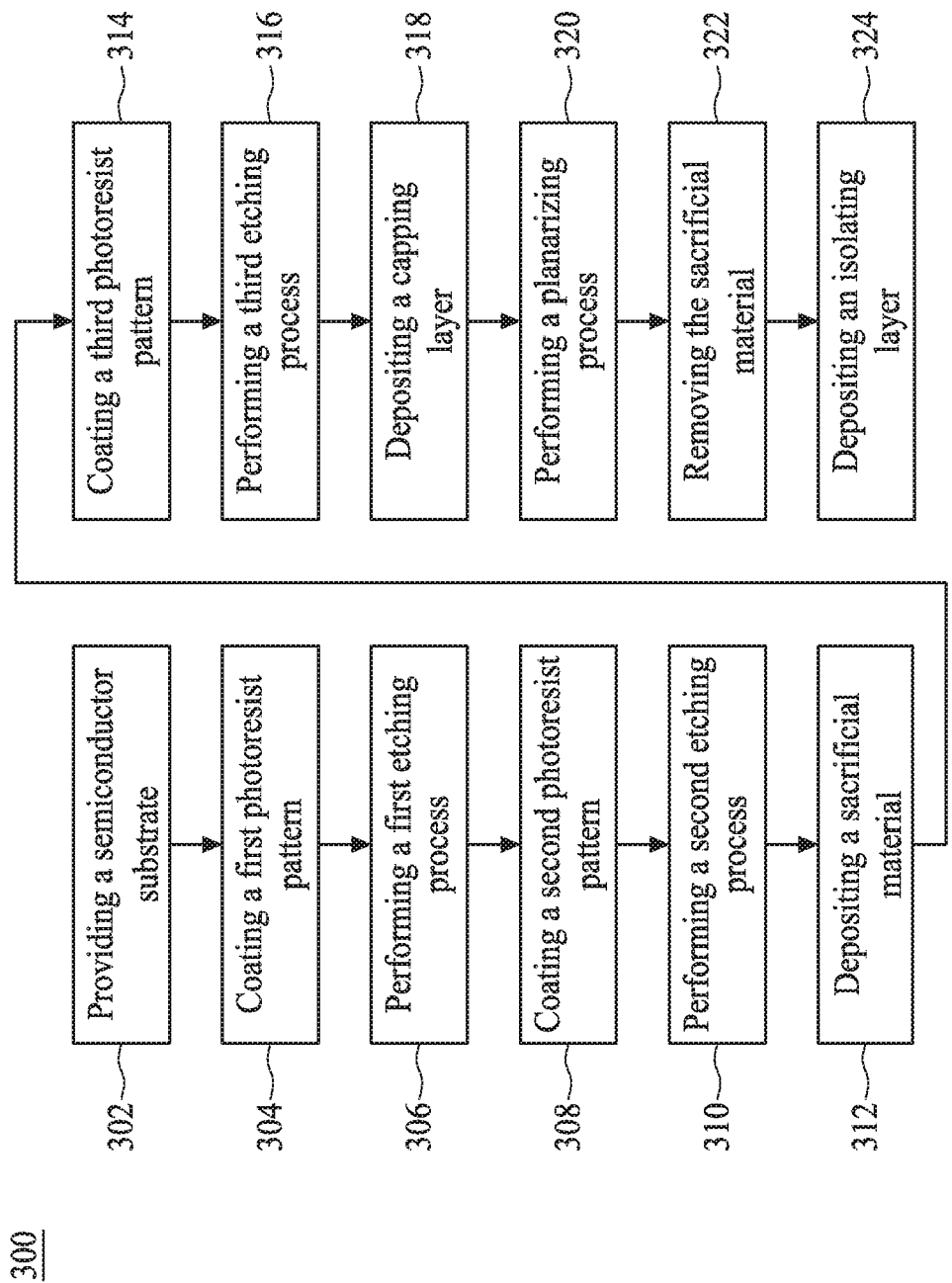
FIG. 5 is a flow diagram illustrating a method of manufacturing a semiconductor structure in accordance with some embodiments of the present disclosure.

FIG. 5 is a flow diagram illustrating a method 300 of manufacturing a semiconductor structure 10 in accordance with some embodiments of the present disclosure. FIGS. 6 to 29 are schematic diagrams illustrating various fabrication stages constructed according to the method 300 for manufacturing the semiconductor structure 10 in accordance with some embodiments of the present disclosure. The stages shown in FIGS. 6 to 29 are also illustrated schematically in the flow diagram in FIG. 5. In the subsequent discussion, the fabrication stages shown in FIGS. 6 to 29 are discussed in reference to the process steps in FIG. 5.

Figure 6:
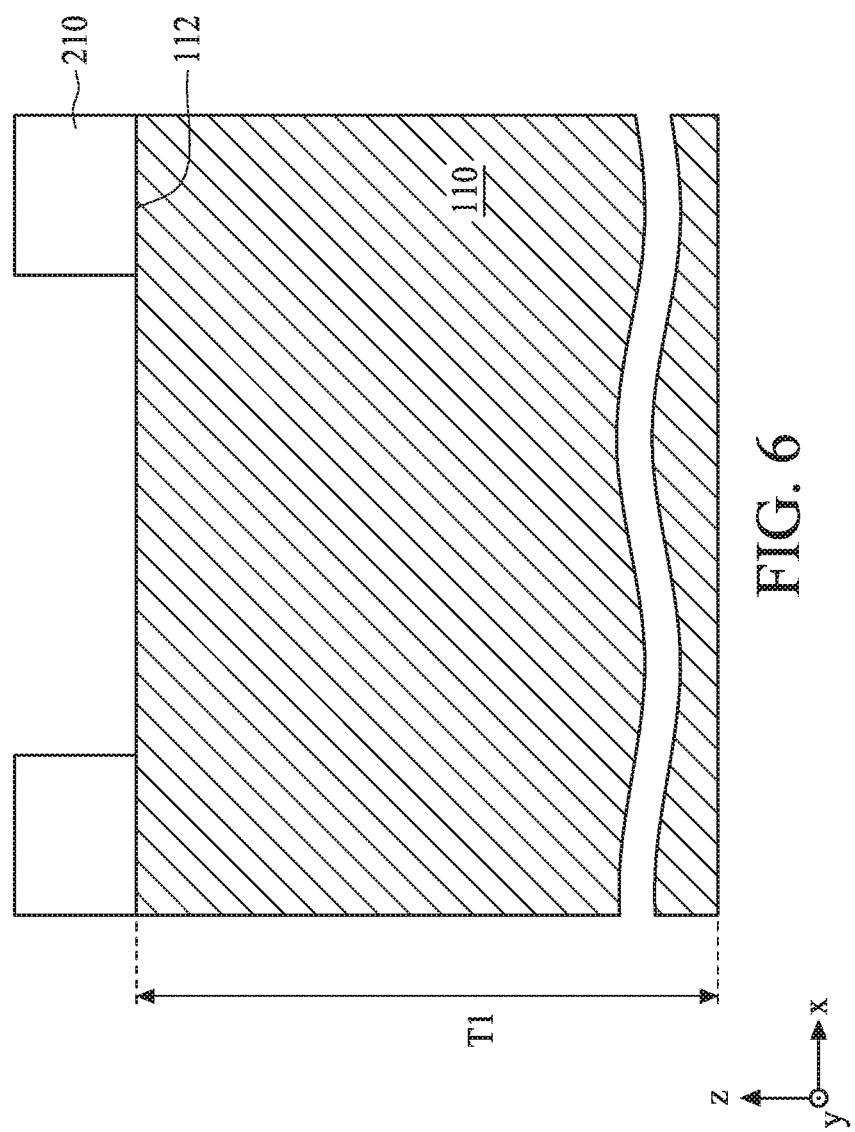
FIGS. 6 to 9 illustrate cross-sectional views of intermediate stages in the formation of a semiconductor structure, in accordance with some embodiments of the present disclosure.

Referring to FIG. 6, a semiconductor substrate 110 is provided according to a step 302 in FIG. 5. In some embodiments, the semiconductor substrate 110 may be a bulk substrate, which may include silicon, silicon germanium, silicon carbon, III-V compound semiconductor material, or the like. In some embodiments, the semiconductor substrate 110 has a thickness T1, which may be, for example, greater than 750 μm, such as about 775 μm.

Next, a first photoresist pattern 210 is coated on a front surface 112 of the semiconductor substrate 110 according a step 304 in FIG. 5. In some embodiments, a portion of the semiconductor substrate 110 is exposed through the first photoresist pattern 210. In some embodiments, the first photoresist pattern 210 may be formed by performing an exposure process and a developing process on a photoresist layer fully covering the front surface 112.

Figure 7:
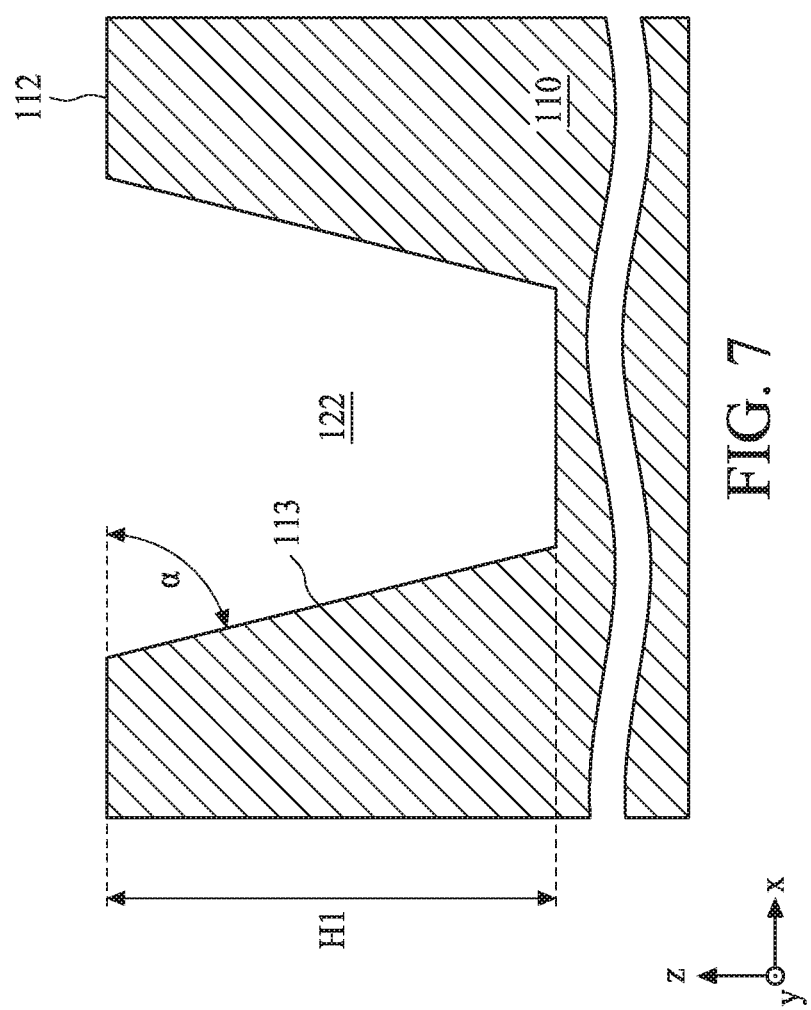

Referring to FIG. 7, in some embodiments, a first etching process is performed to remove a portion of the semiconductor substrate 110 according to a step 306 in FIG. 5. Accordingly, an initial opening 122 is formed. After the first etching process, the first photoresist pattern 210 is removed, for example, by an ashing process or a wet strip process, wherein the wet strip process may chemically alter the first photoresist pattern 210 so that it no longer adheres to the semiconductor substrate 110. In some embodiments, the initial opening 122 does not penetrate through the semiconductor substrate 110. In some embodiments, an angle α between the front surface 112 and an inner surface 113 adjacent to the upper surface 112 is in a range between 85 and 90 degrees. In some embodiments, the initial opening 122 has a height H1, which may be, for example, in a range between 40 and 50 μm. In some embodiments, the semiconductor substrate 110 is etched using a dry etching process.

Figure 8:
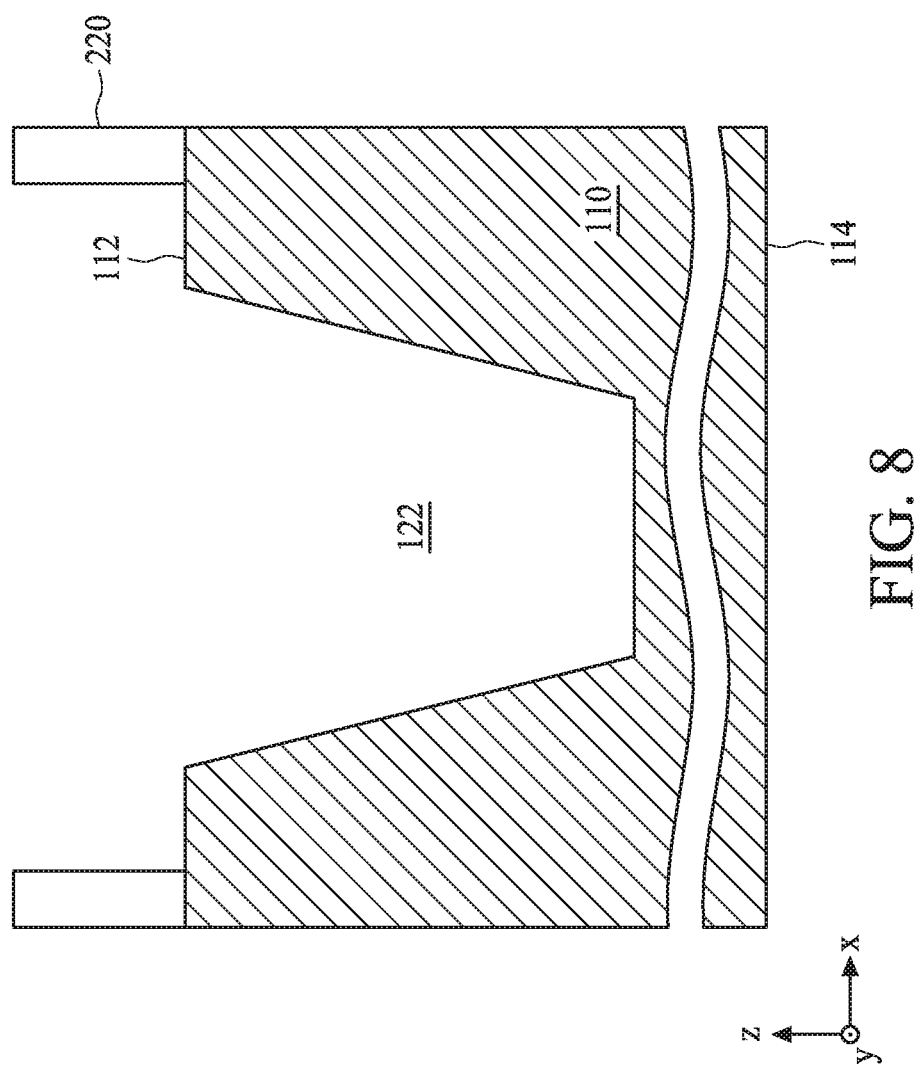

Referring to FIG. 8, in some embodiments, a second photoresist pattern 220 is coated on the front surface 112 of the semiconductor substrate 110 according to a step 308 in FIG. 5. In some embodiments, the initial openings 122 and a portion of the front surface 112 are exposed through the second photoresist pattern 220.

Figure 9:
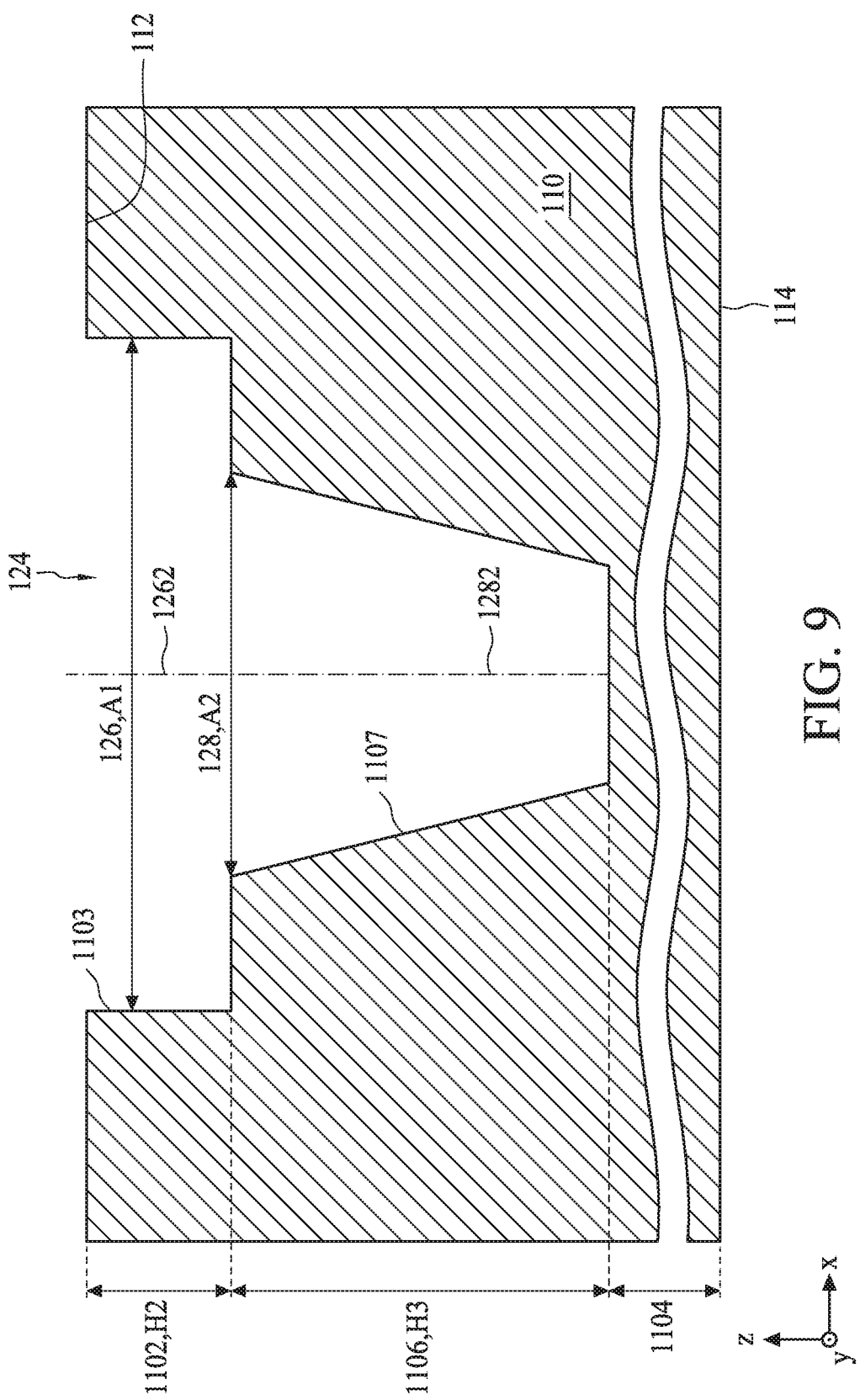

Referring to FIG. 9, in some embodiments, a second etching process is performed to further remove portions of the semiconductor substrate 110 according to a step 310 in FIG. 5. Accordingly, a stepped opening 124 is formed. After the second etching process, the second photoresist pattern 220 is removed, for example, by an asking process or a wet strip process. In some embodiments, a portion of the semiconductor substrate 110 connected to the front surface 112 and a portion of the semiconductor substrate 110 beneath the initial opening 122 (as shown in FIGS. 7 and 8) are removed.

In the resulting structure, the semiconductor substrate 110 may be defined with an upper portion 1102 connected the front surface 112, a bottom portion 1104 connected a back surface 114 opposite to the front surface 112, and a middle portion 1106 sandwiched between the upper portion 1102 and the bottom portion 1104. In some embodiments, the upper portion 1102 has a height H2, which may be, for example, in a range between 10 and 15 μm. In some embodiments, the middle portion 1106 has a height 113, which may be in a range between 40 and 50 μm. In some embodiments, the upper portion 1102 includes a first opening 126 and the middle portion 1106 includes a second opening 128 communicating with the first opening 126, wherein the first opening 126 and the second opening 128 constitute the stepped opening 124. In some embodiments, a central line 1262 of the first opening 126 coincides with a central line 1282 of the second opening 128. In some embodiments, the first opening 126 includes a first diameter A1, which is greater than a second diameter A2 (e.g., an upper or maximum diameter) of the second opening 128. In some embodiments, the first diameter A1 may be constant, and the second diameter A2 gradually increases at positions of increasing distance from the bottom portion 1102. In some embodiments, the upper portion 1102 includes a sidewall 1103 which is not continuous with a sidewall 1107 of the middle portion 1106. In some embodiments, the second etching process is, for example, a dry etching process.

Figure 10:
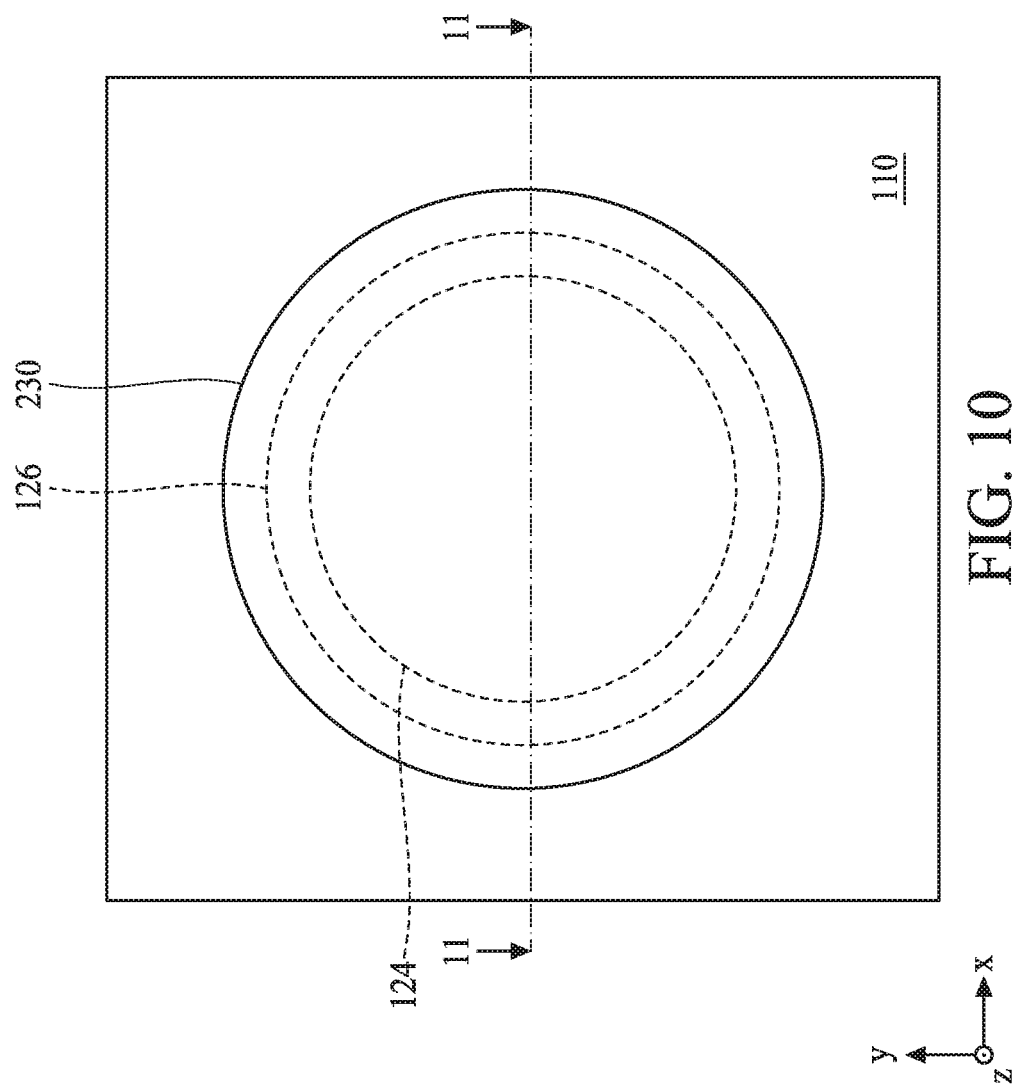
FIG. 10 is a top view of an intermediate stage in the formation of the semiconductor structure, in accordance with some embodiments of the present disclosure.
Figure 11:
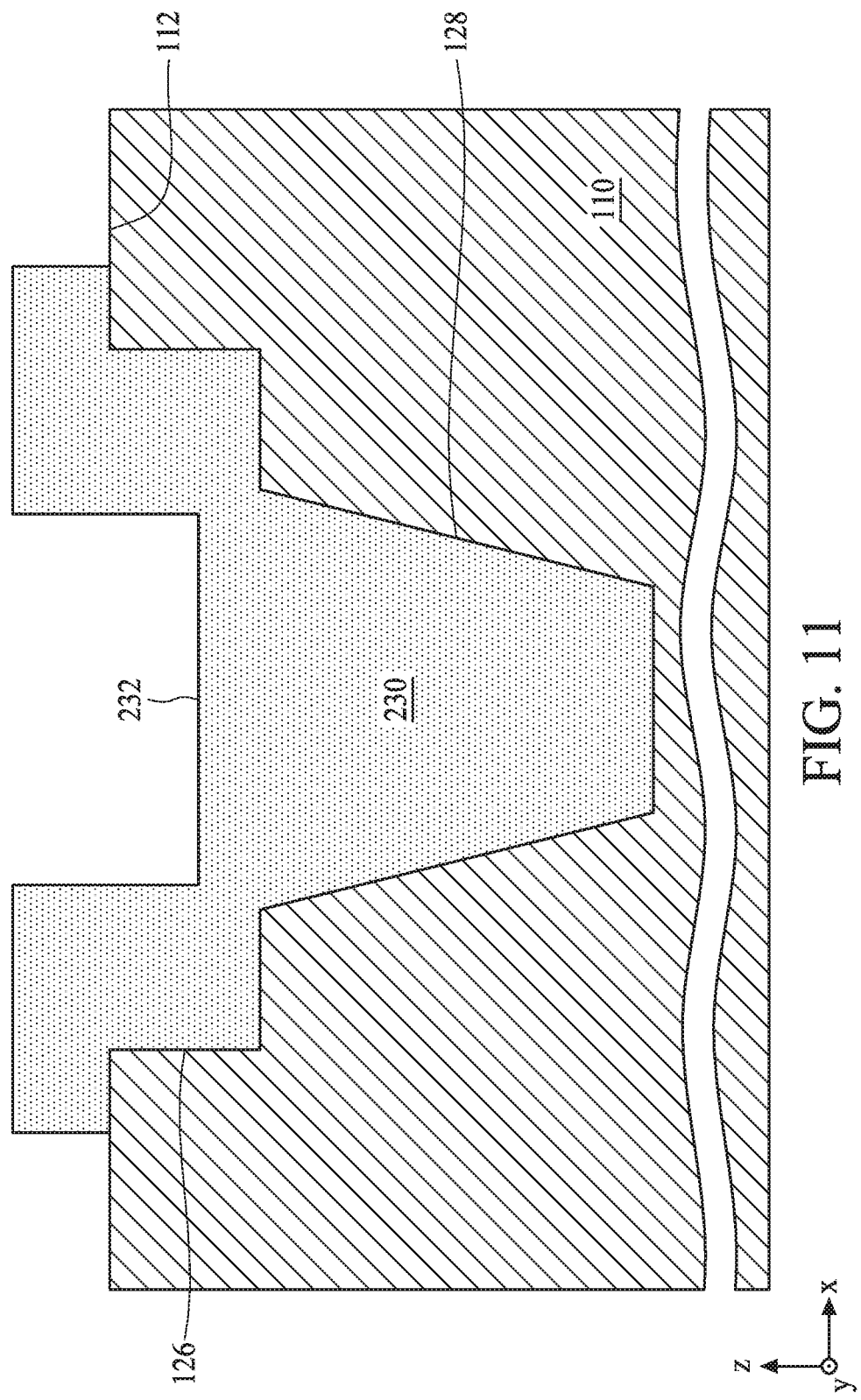
FIG. 11 is a cross-sectional view taken along the line 11-11 illustrated in FIG. 10.

Referring to FIGS. 10 and 11, in some embodiments, a sacrificial material 230 is deposited on the front surface 112 and into the first opening 126 and the second opening 128 according to a step 312 in FIG. 5. In some embodiments, the sacrificial material 230 may be deposited to completely fill the second opening 128 and partially fill the first opening 126. In some embodiments, a surface 232 of the sacrificial material 230 in the first opening 126 is lower than the front surface 112. In some embodiments, the sacrificial material 230 has a circular shape when viewed in a plan view. In some embodiments, a portion of the front surface 112 may be exposed through the sacrificial material 230. Such partial filling of the first opening 126 results in a corresponding decrease in filling time, and consequently increases the throughput of the process. The partial filling also conserves the use of the sacrificial material 230. In some embodiments, the sacrificial material 230 includes oxide. In some embodiments, the sacrificial material 230 may include silicon oxide (SiO) or silicon dioxide (SiO$_2$). In some embodiments, the sacrificial material 230 is formed using a chemical vapor deposition (CVD) process.

Figure 12:
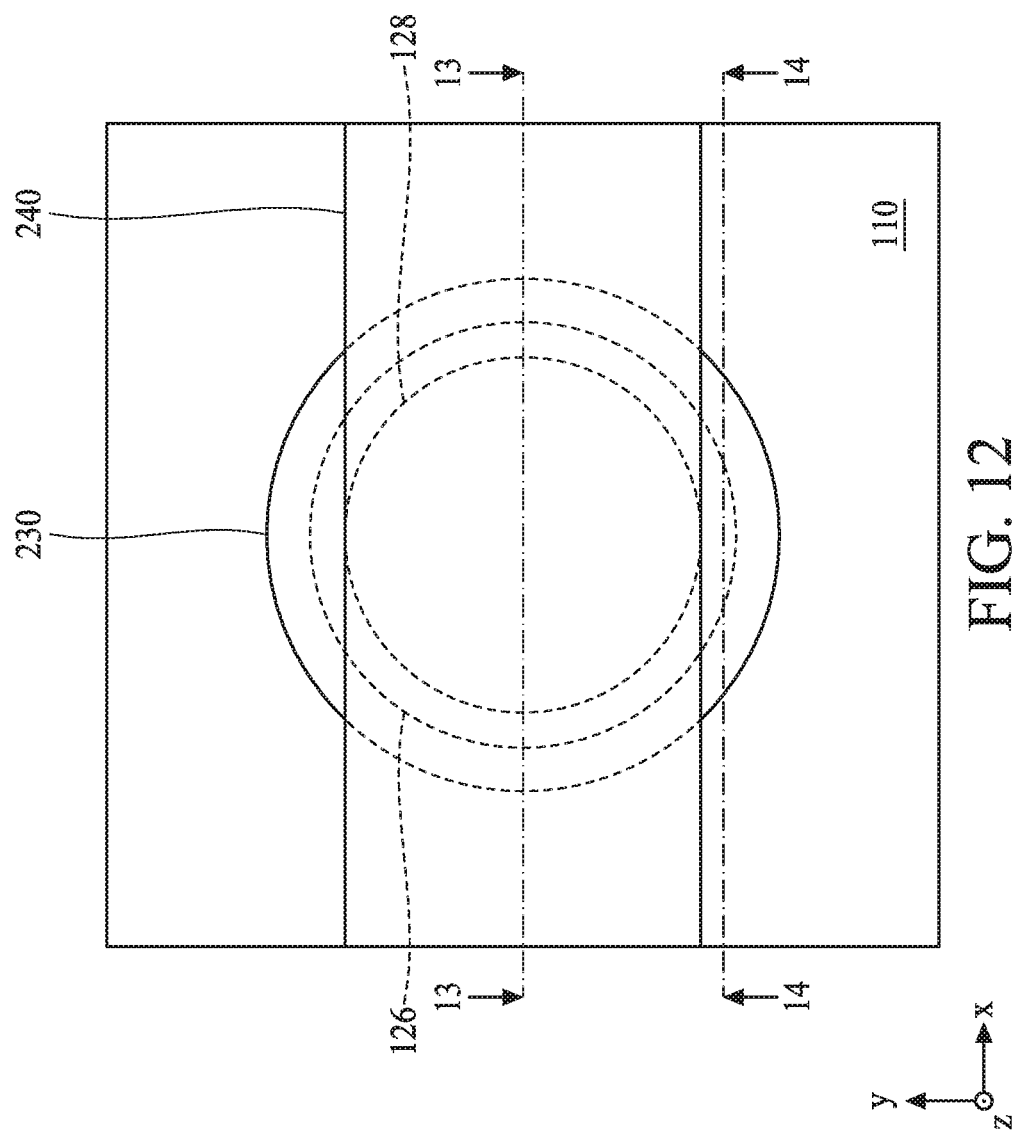
FIG. 12 is a top view of an intermediate stage in the formation of the semiconductor structure, in accordance with some embodiments of the present disclosure.
Figure 13:
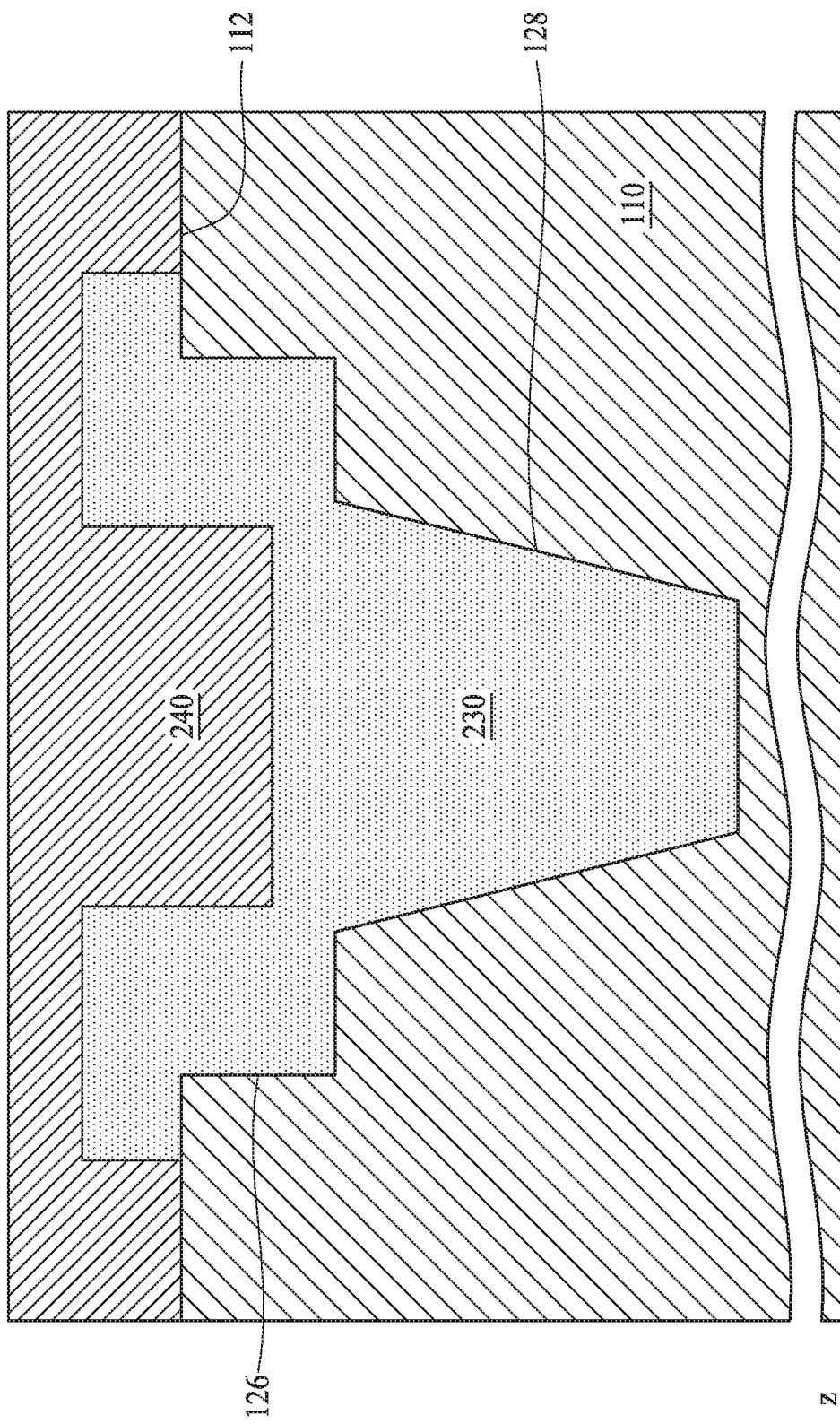
FIG. 13 is a cross-sectional view taken along the line 13-13 illustrated in FIG. 12.
Figure 14:
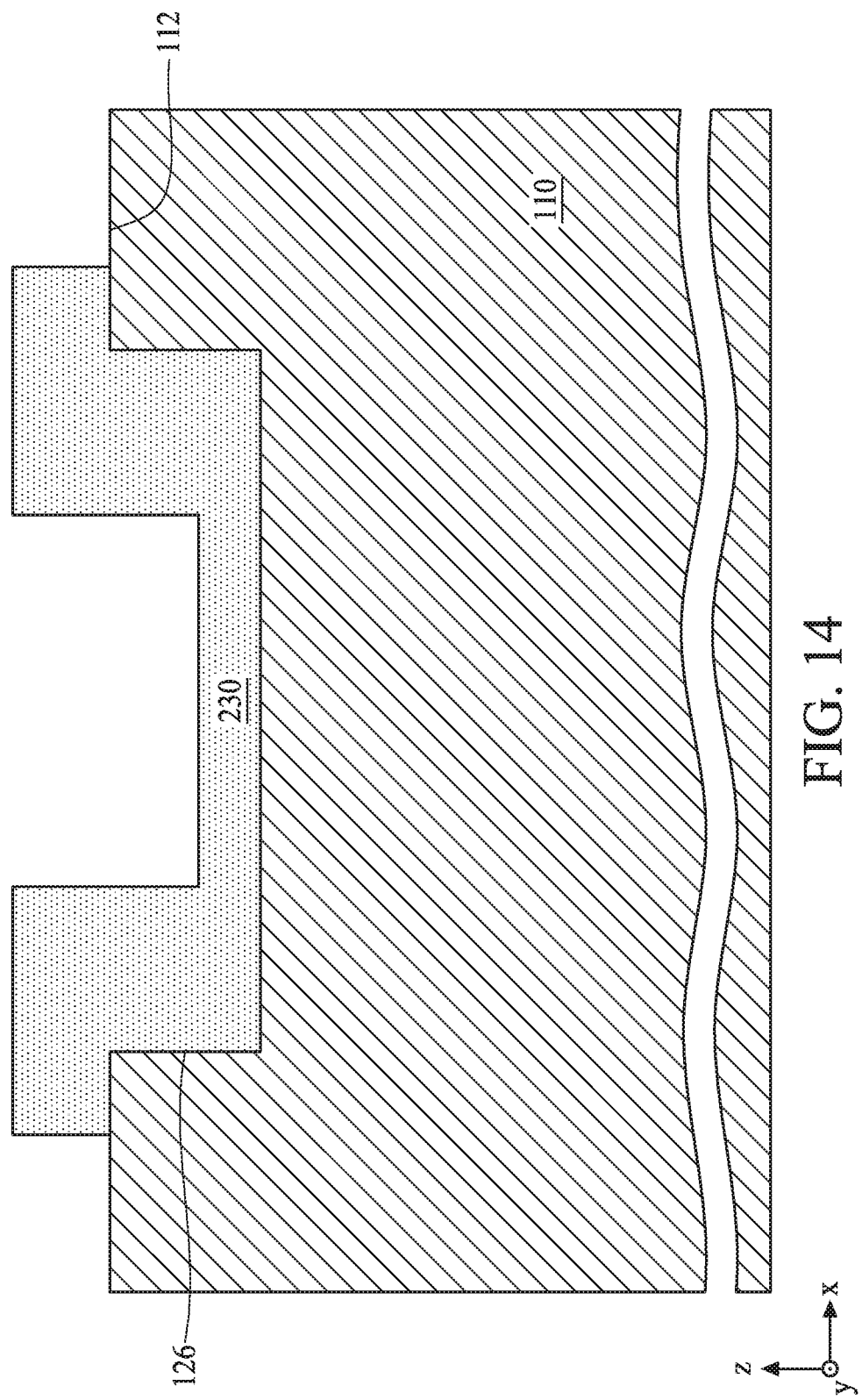
FIG. 14 is a cross-sectional view taken along the line 14-14 illustrated in FIG. 12.

Referring to FIGS. 12 to 14, in some embodiments, a third photoresist pattern 240 is applied to cover a portion of the sacrificial material 230 according to a step 314 in FIG. 5. In some embodiments, the third photoresist pattern 240 has a rectangular shape when viewed in a plan view. In some embodiments, the third photoresist pattern 240 may extend in a first direction x to cover a portion of the semiconductor substrate 110 and the sacrificial material 230. In some embodiments, the second opening 128 is fully protected by the third photoresist pattern 240, and the first opening 126 is partially protected by the third photoresist pattern 240.

Figure 15:
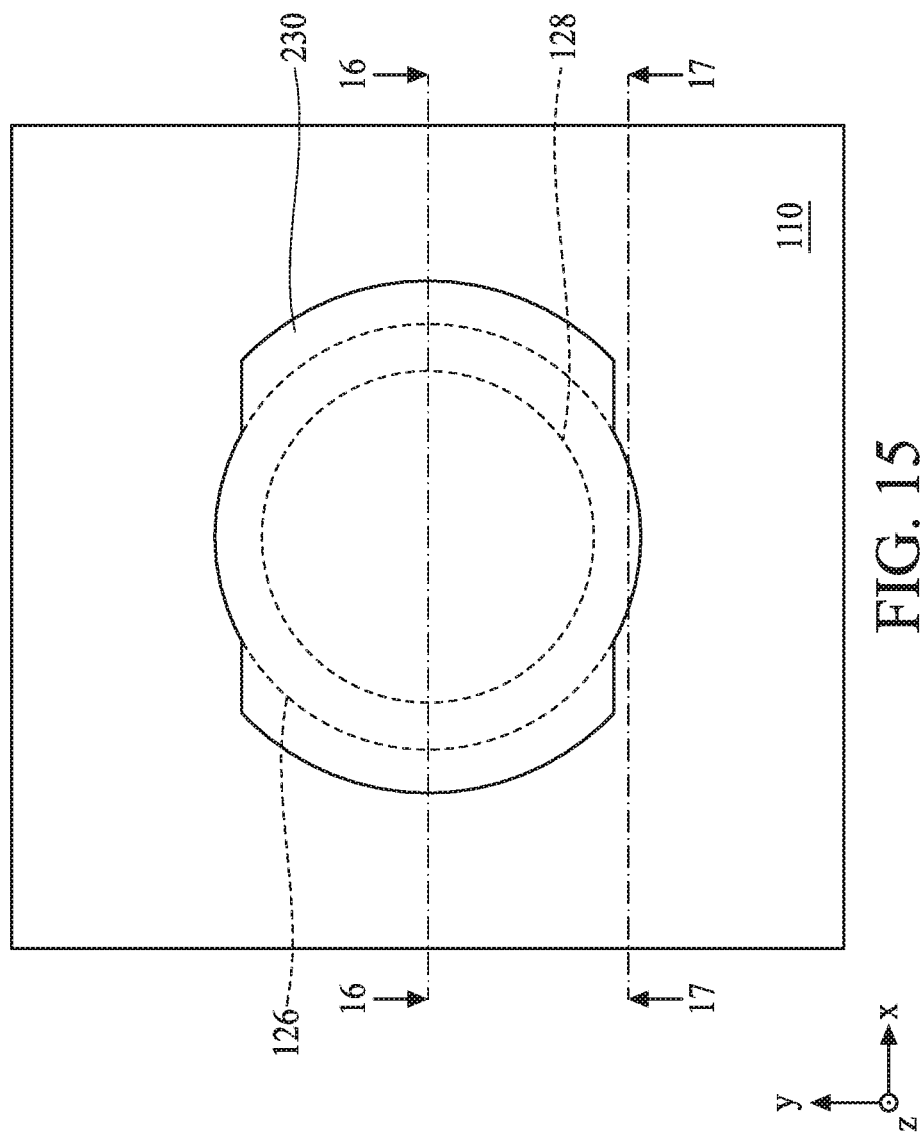
FIG. 15 is a top view of an intermediate stage in the formation of the semiconductor structure, in accordance with some embodiments of the present disclosure.
Figure 16:
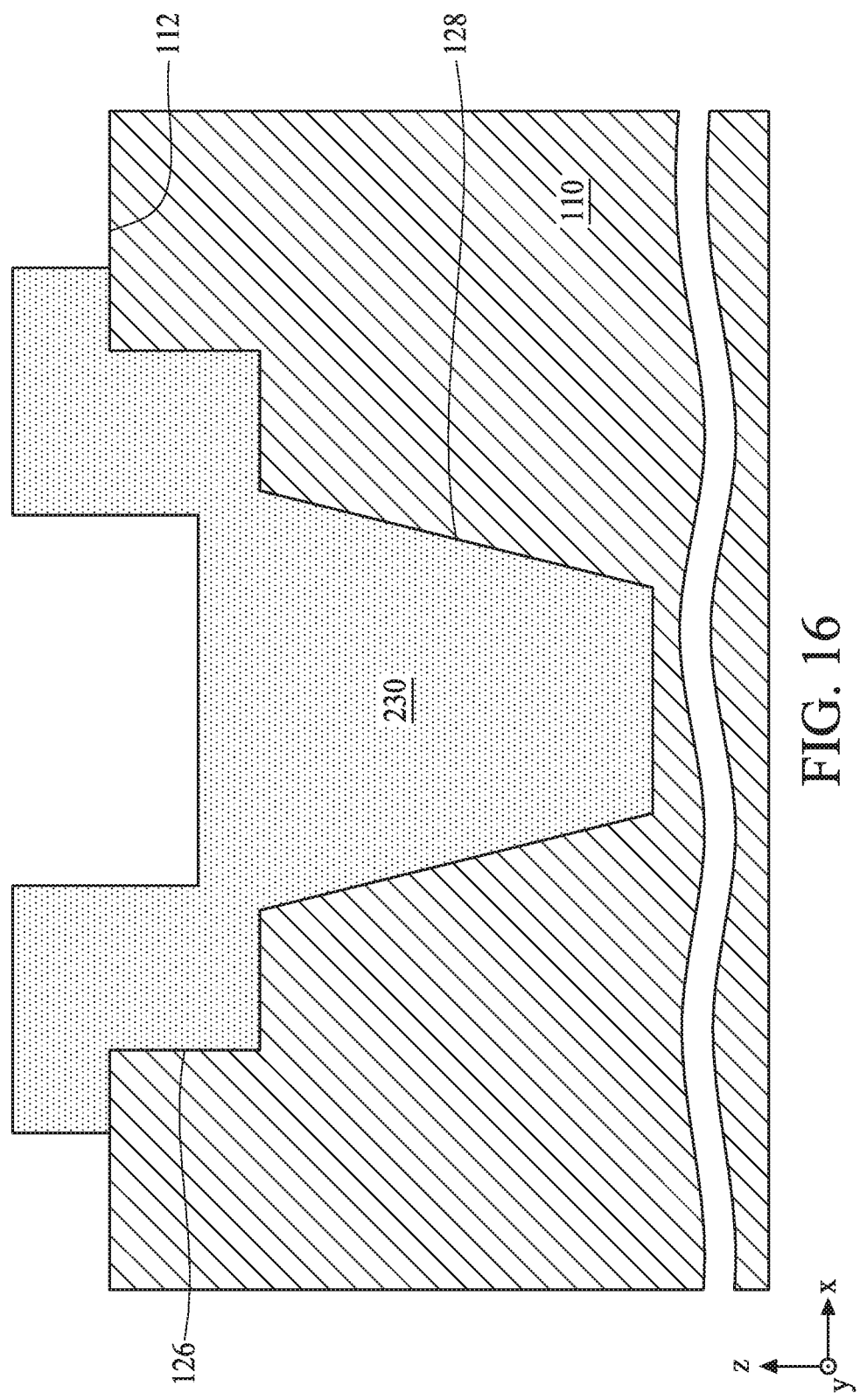
FIG. 16 is a cross-sectional view taken along the line 16-16 illustrated in FIG. 15.
Figure 17:
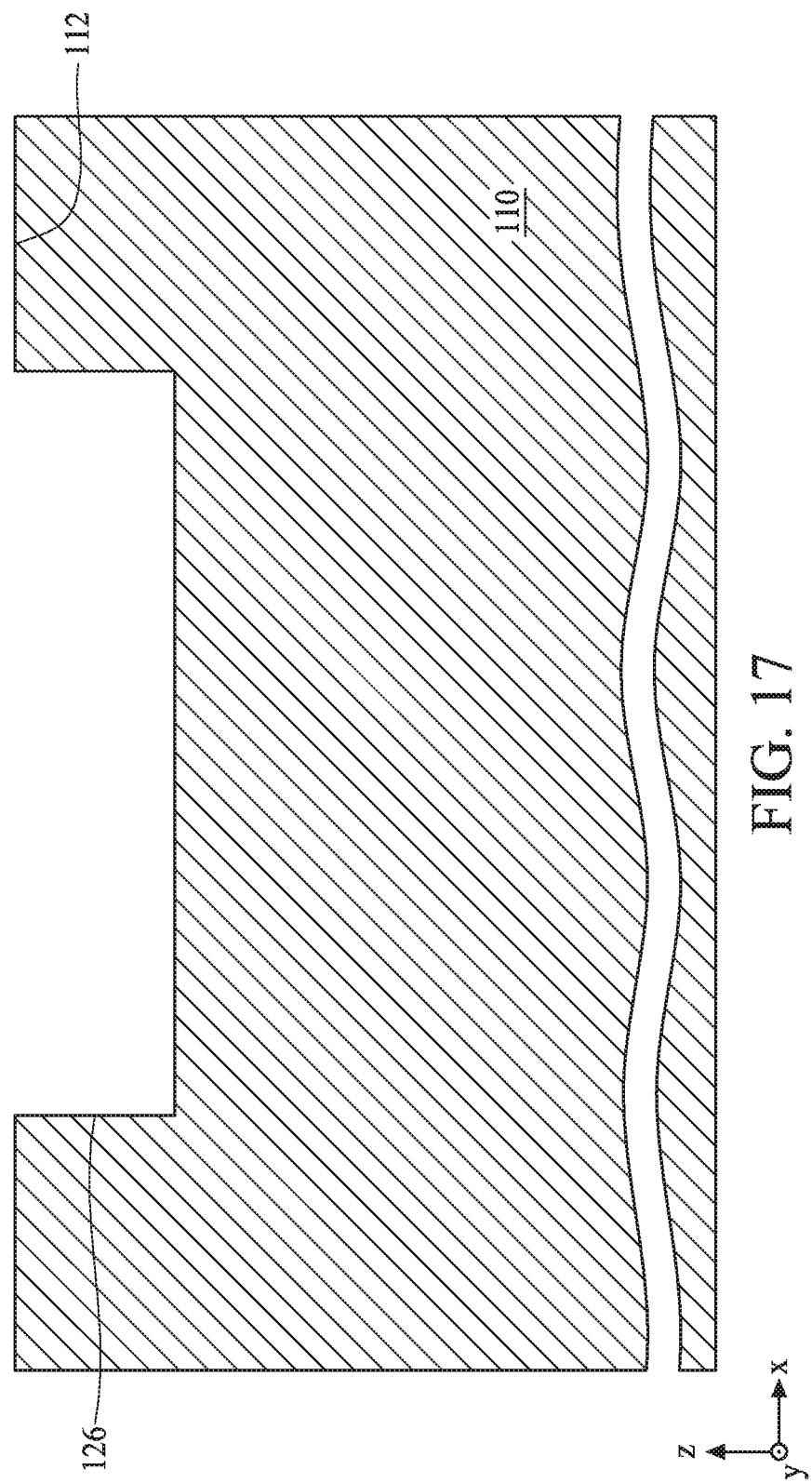
FIG. 17 is a cross-sectional view taken along the line 17-17 illustrated in FIG. 15.

Referring to FIGS. 15 to 17, in some embodiments, a third etching process is performed to remove the sacrificial material 230 exposed through the third photoresist pattern 240 according to a step 316 in FIG. 5. In some embodiments, a portion of the sacrificial material 230 in the first opening 126 is etched using the third photoresist pattern 240 as an etching mask. In some embodiments, the third etching process is, for example, a dry etching process. After the third etching process, the third photoresist pattern 240 is removed, for example, by an asking process or a wet strip process.

Figure 18:
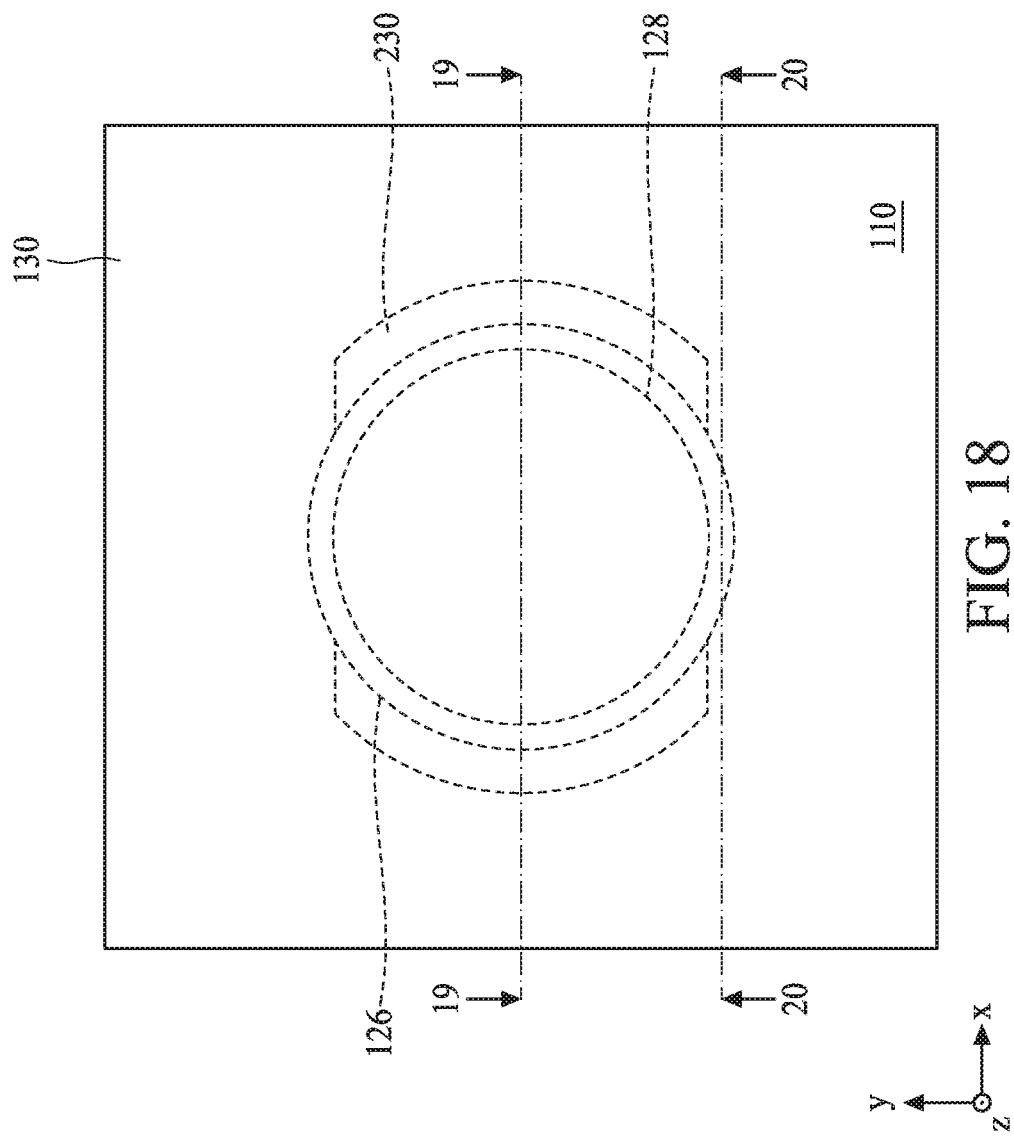
FIG. 18 is a top view of an intermediate stage in the formation of the semiconductor structure, in accordance with some embodiments of the present disclosure.
Figure 19:
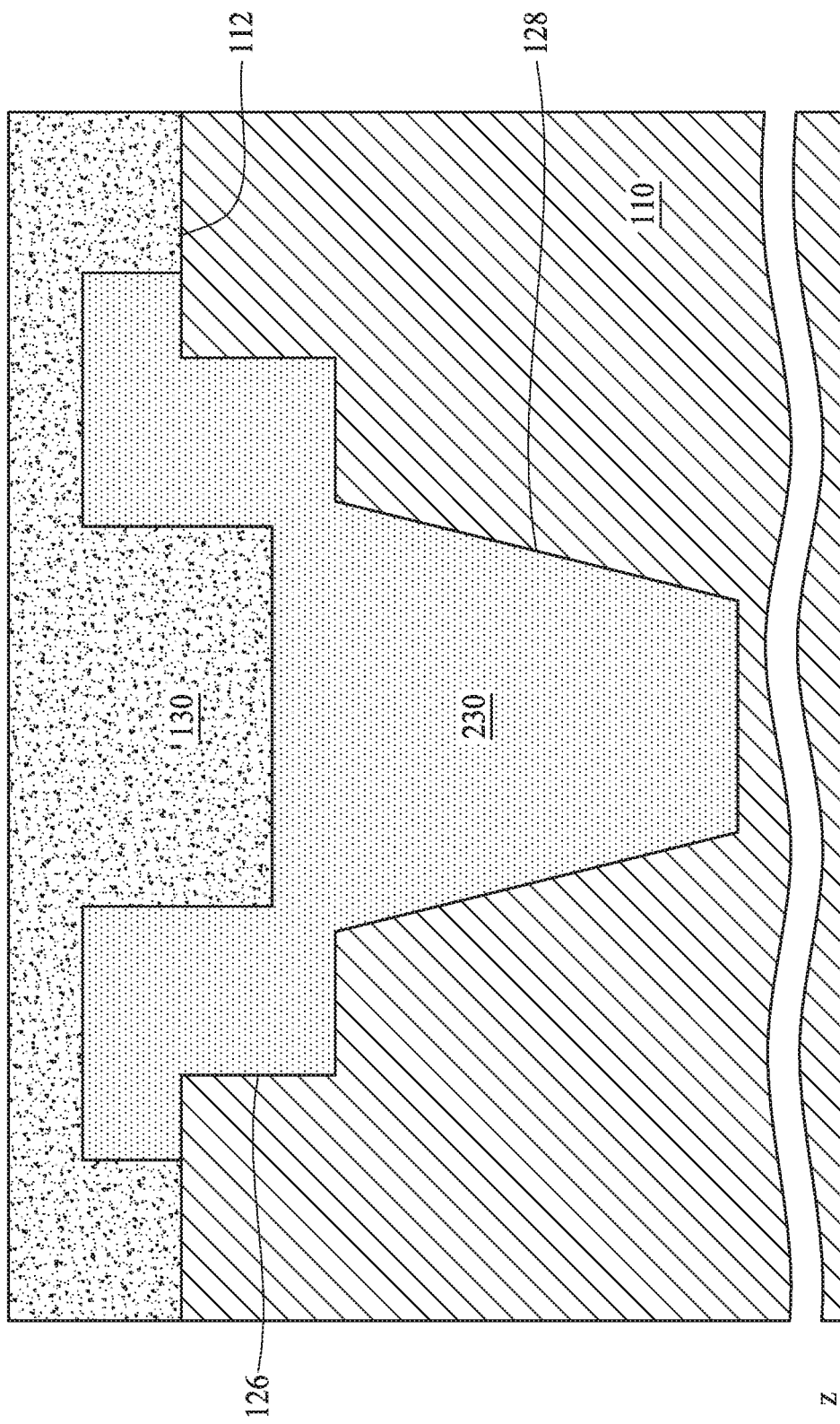
FIG. 19 is a cross-sectional view taken along the line 19-19 illustrated in FIG. 18.
Figure 20:
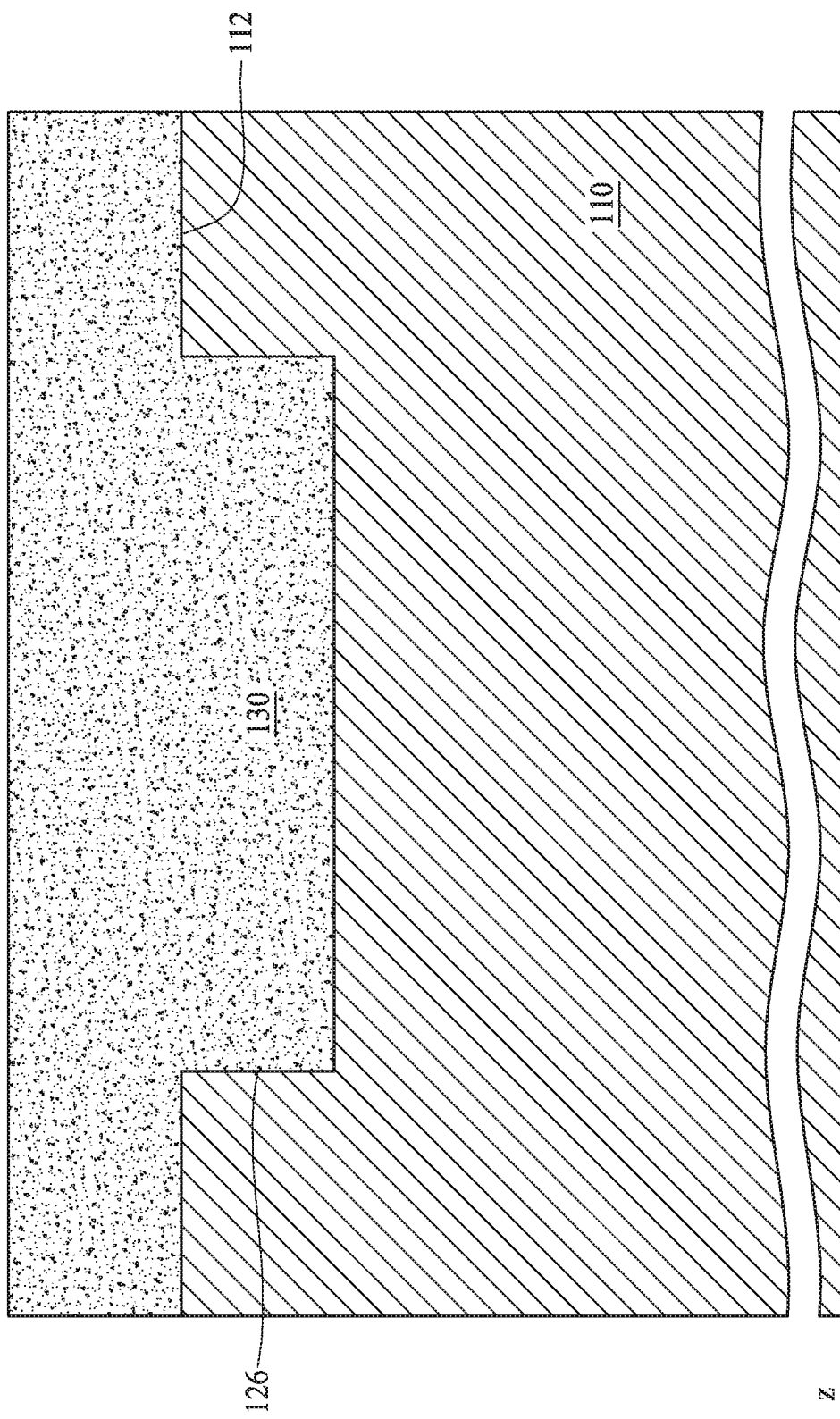
FIG. 20 is a cross-sectional view taken along the line 20-20 illustrated in FIG. 18.

Referring to FIGS. 18 to 20, in some embodiments, a capping layer 130 is deposited on the semiconductor substrate 110 and the sacrificial material 230 according to a step 318 in FIG. 5. In some embodiments, the capping layer 130 may be deposited to completely fill the first opening 126 where the sacrificial material 230 is not disposed. In some embodiments, the capping layer 130 fully covers the remaining sacrificial material 230 and the semiconductor substrate 110. In some embodiments, the capping layer 130 includes polysilicon. In some embodiments, the capping layer 130 is formed using a CVD process.

Figure 21:
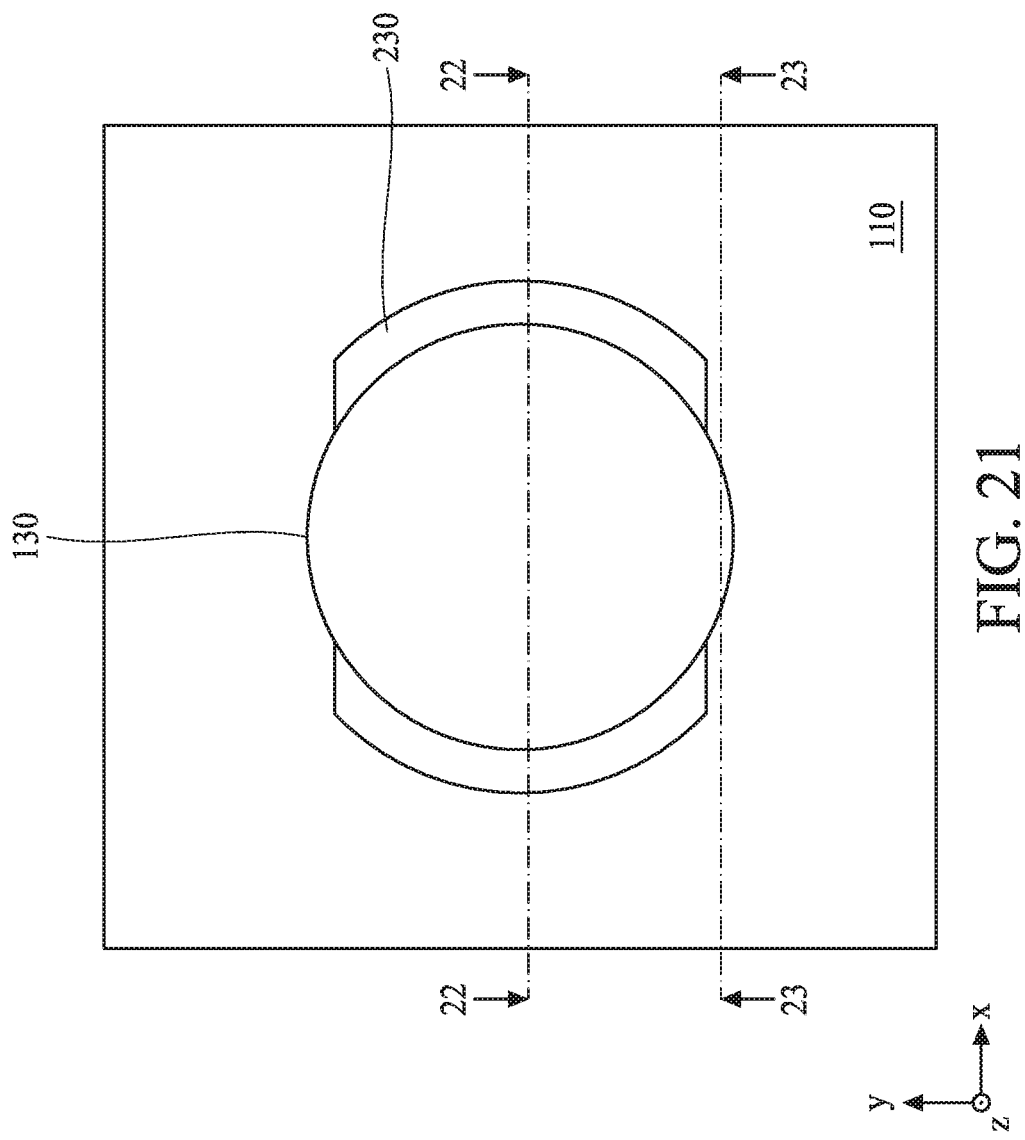
FIG. 21 is a top view of an intermediate stage in the formation of the semiconductor structure, in accordance with some embodiments of the present disclosure.
Figure 22:
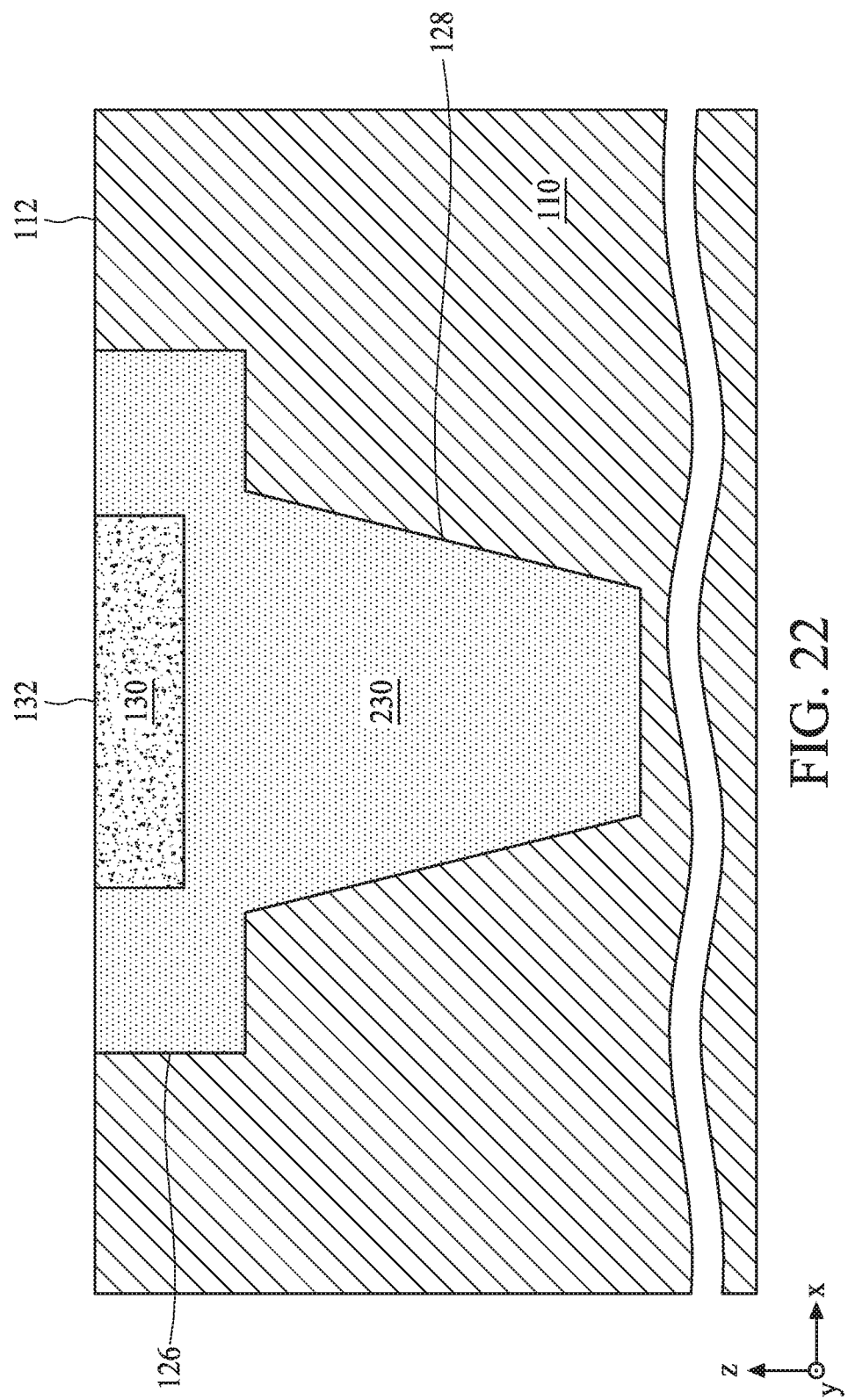
FIG. 22 is a cross-sectional view taken along the line 22-22 illustrated in FIG. 21.
Figure 23:
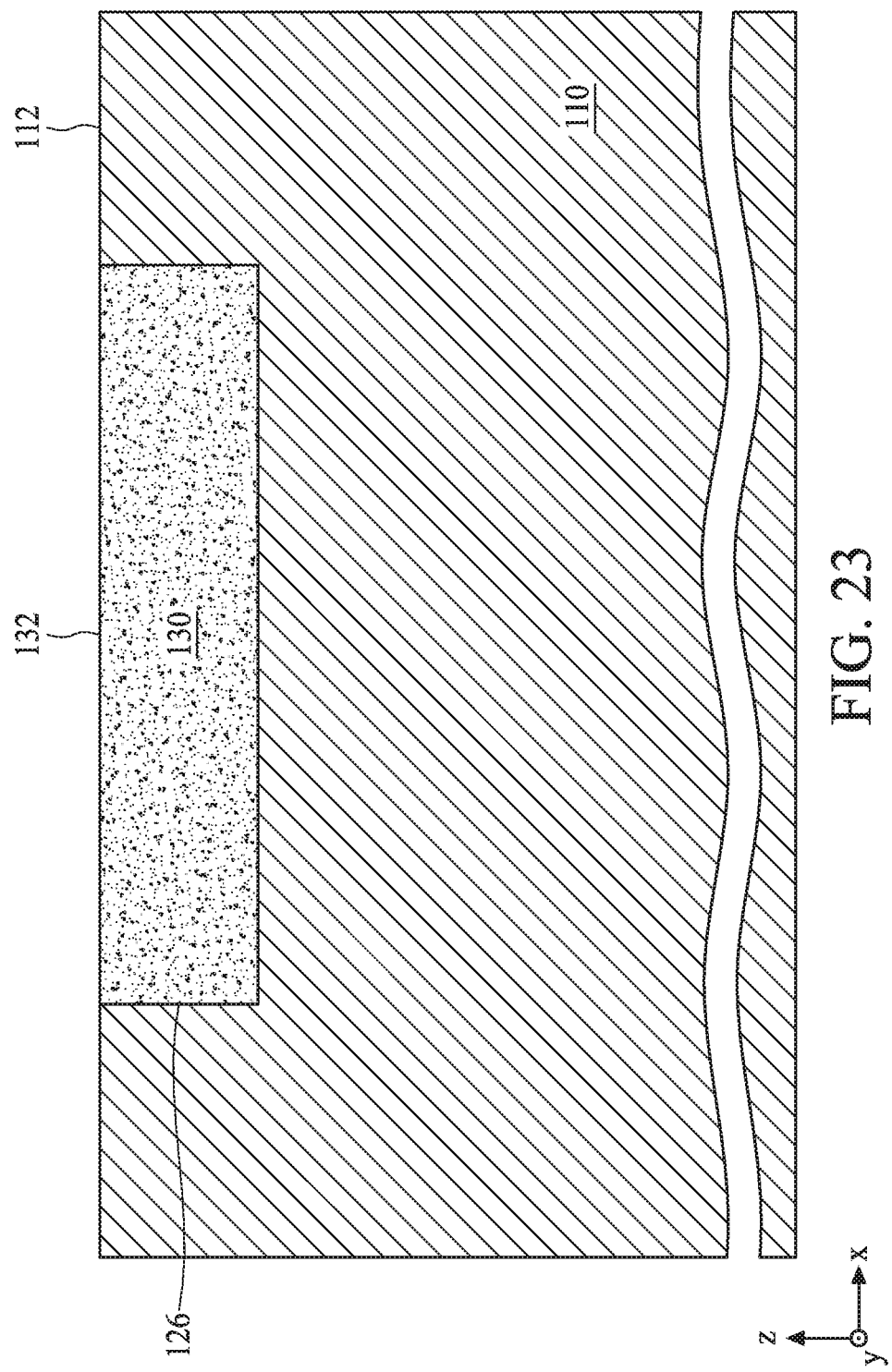
FIG. 23 is a cross-sectional view taken along the line 23-23 illustrated in FIG. 21.
Figure 24:
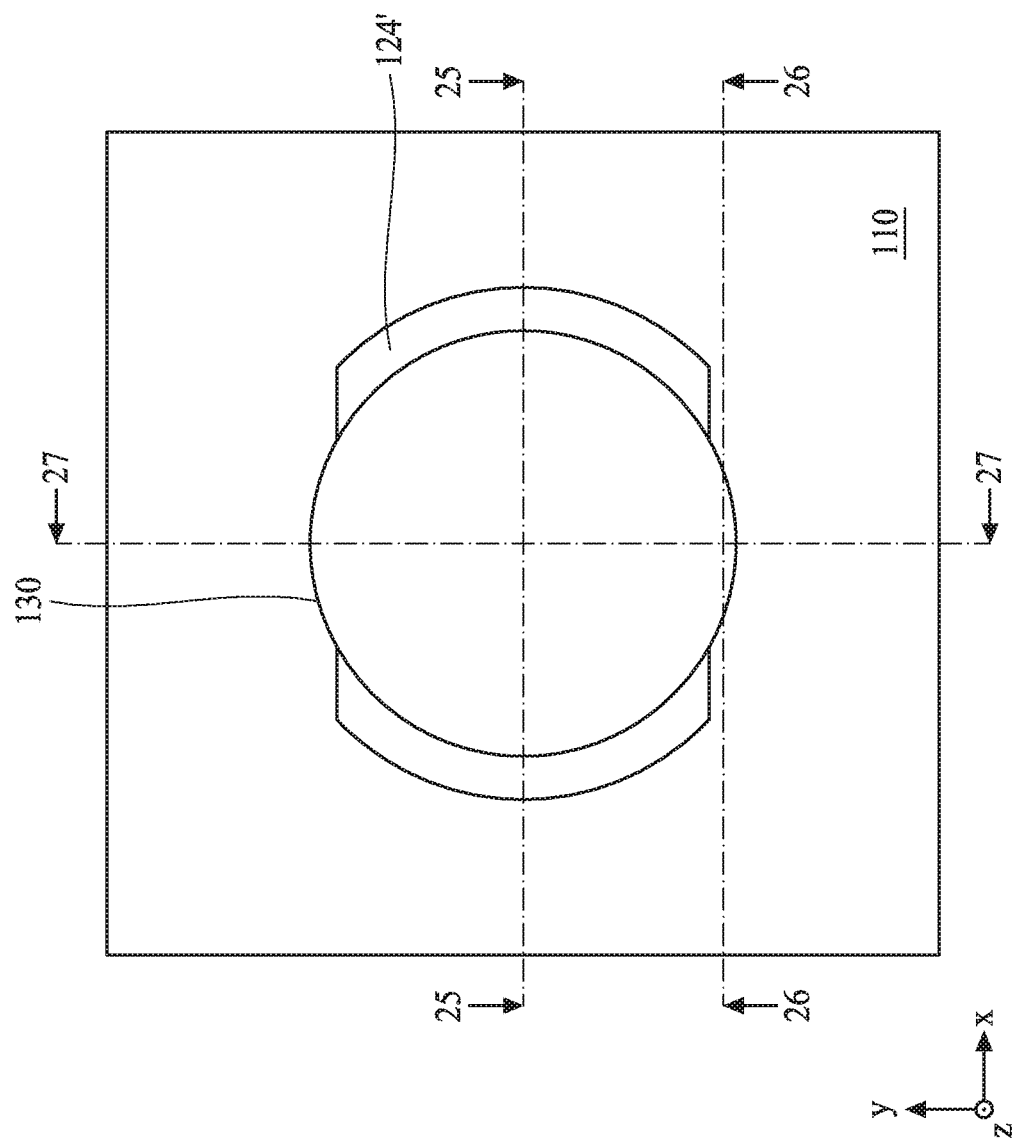
FIG. 24 is a top view of an intermediate stage in the formation of the semiconductor structure, in accordance with some embodiments of the present disclosure.
Figure 25:
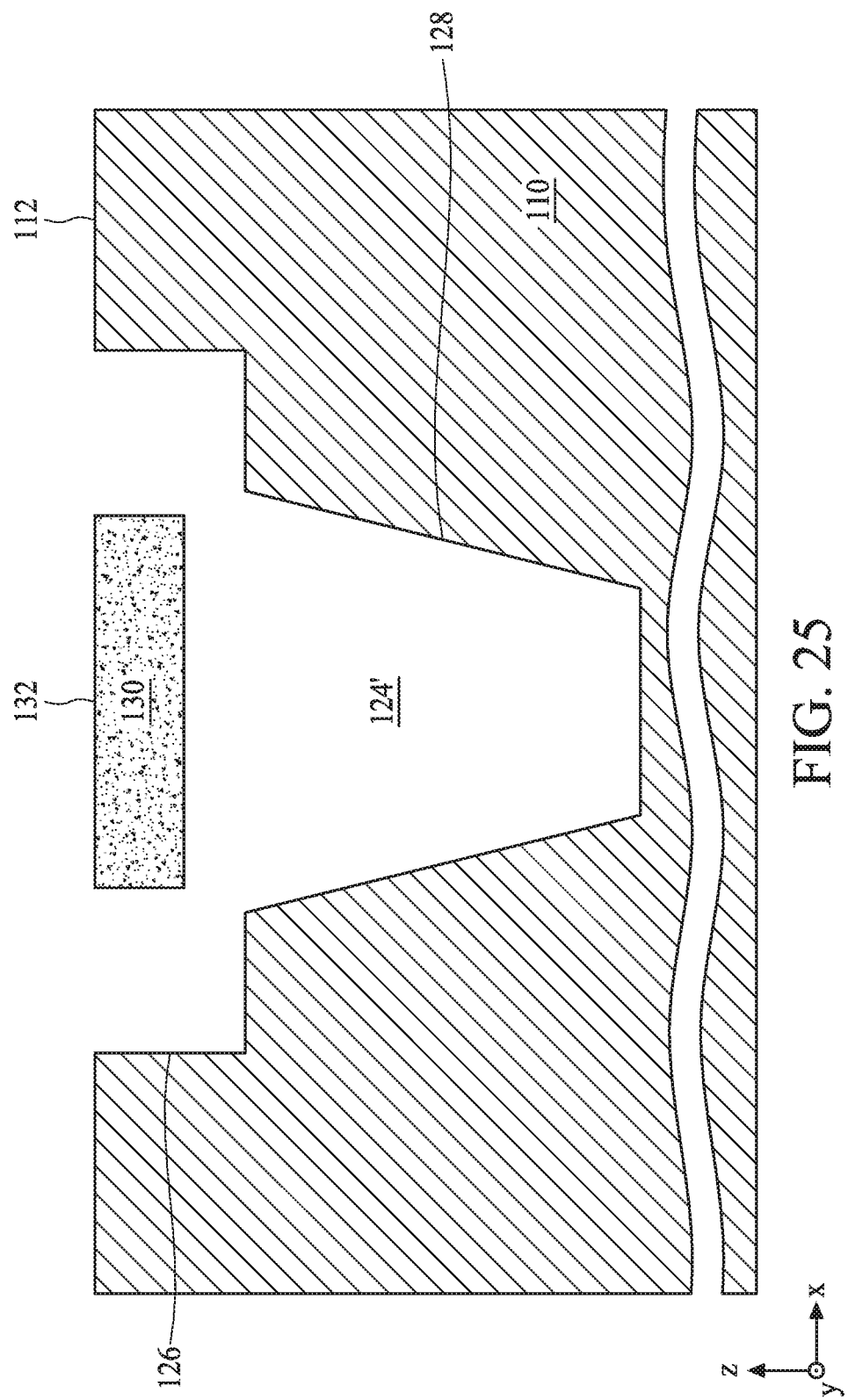
FIG. 25 is a cross-sectional view taken along the line 25-25 illustrated in FIG. 24.
Figure 26:
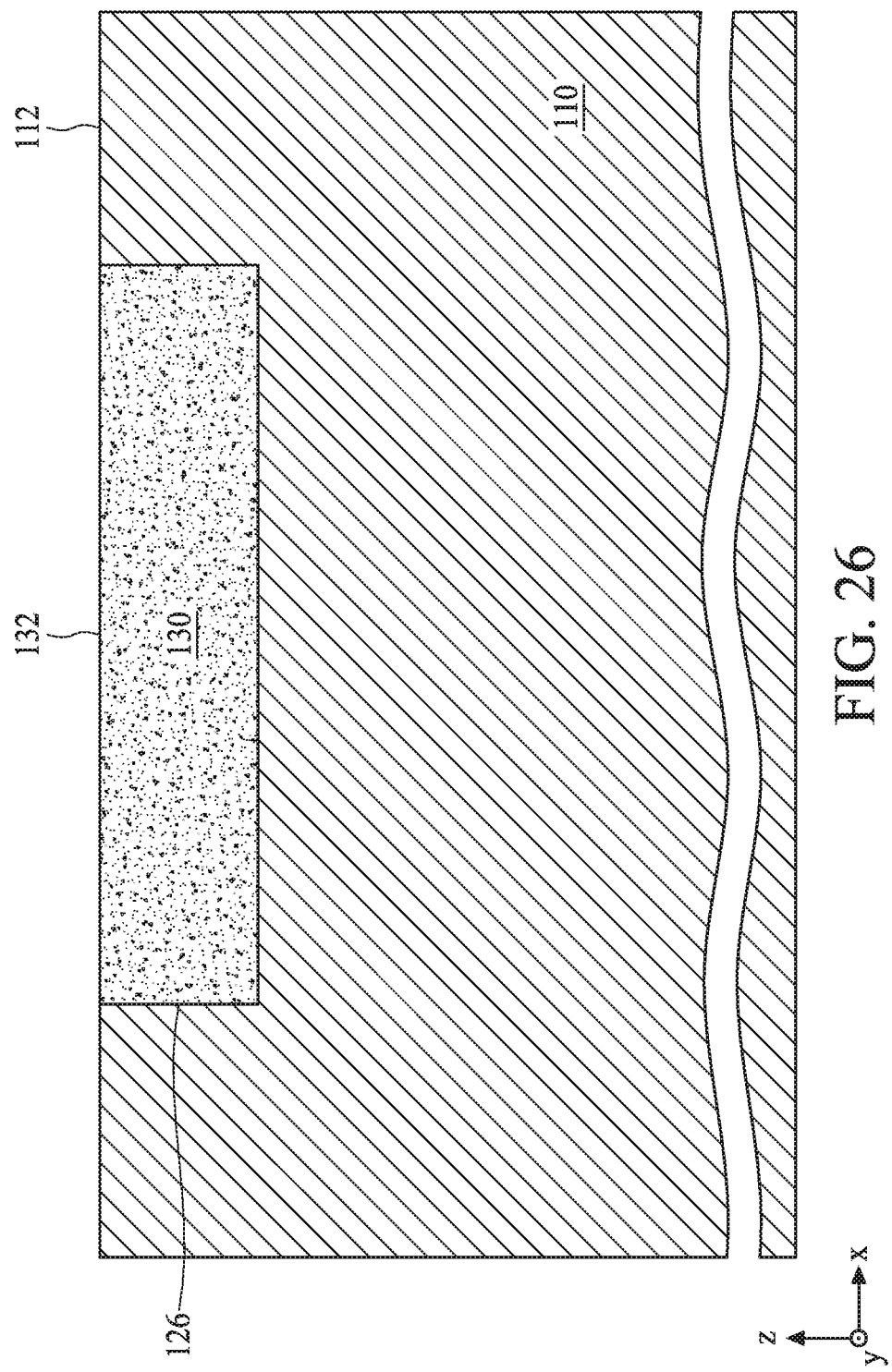
FIG. 26 is a cross-sectional view taken along the line 26-26 illustrated in FIG. 24.
Figure 27:
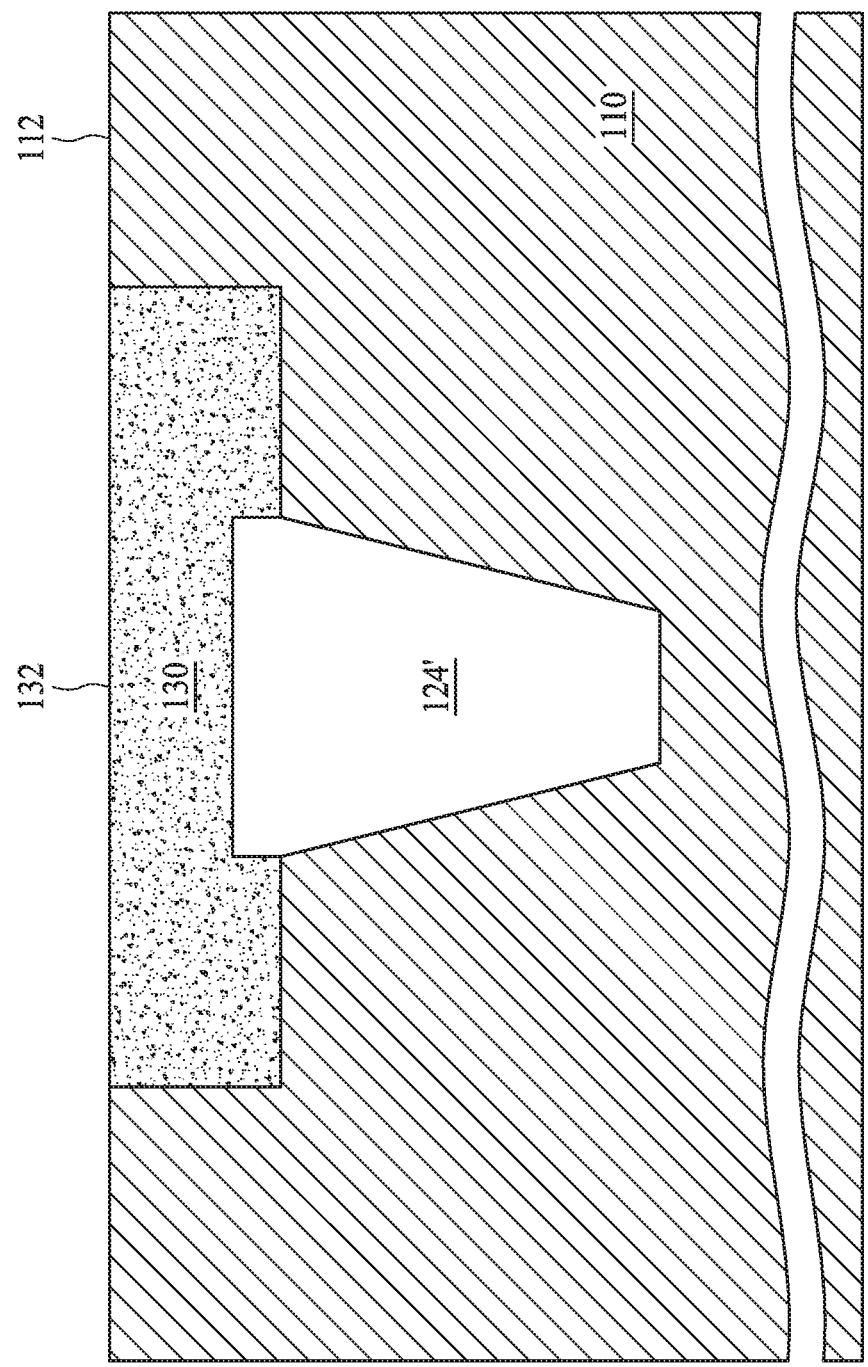
FIG. 27 is a cross-sectional view taken along the line 27-27 illustrated in FIG. 24.

Referring to FIGS. 21 to 23, a planarization process is performed according to a step 320 in FIG. 5. In some embodiments, the planarization process stops at the semiconductor substrate 110. In some embodiments, the capping layer 130 and the sacrificial material. 230 are planarized to expose the front surface 112. In some embodiments, the planarization process comprises a chemical mechanical polishing (CMP) process. In some embodiments, the remaining capping layer 130 includes an upper surface 132, which is coplanar with the front surface 112.

Referring to FIGS. 24 to 27, in some embodiments, the sacrificial material 230 is removed from the semiconductor substrate 110 according to a step 322 in FIG. 5. As a result, a stepped opening 124' previously filled with the sacrificial material 230 is no longer filled with the sacrificial material 230. Because the sacrificial material 230 is removed after the deposition of the capping layer 130, the shape of the stepped opening 124' is the same as the shape occupied by the sacrificial material 230. In some embodiments, hydrofluoric acid (HF) is employed to remove the sacrificial material 230 within the stepped opening 124' to expose the semiconductor substrate 110. In some embodiments, hydrofluoric acid in various dilutions in water and buffered with ammonium fluoride ($NH_4F$) is the standard silicon dioxide wet etchant.

Figure 28:
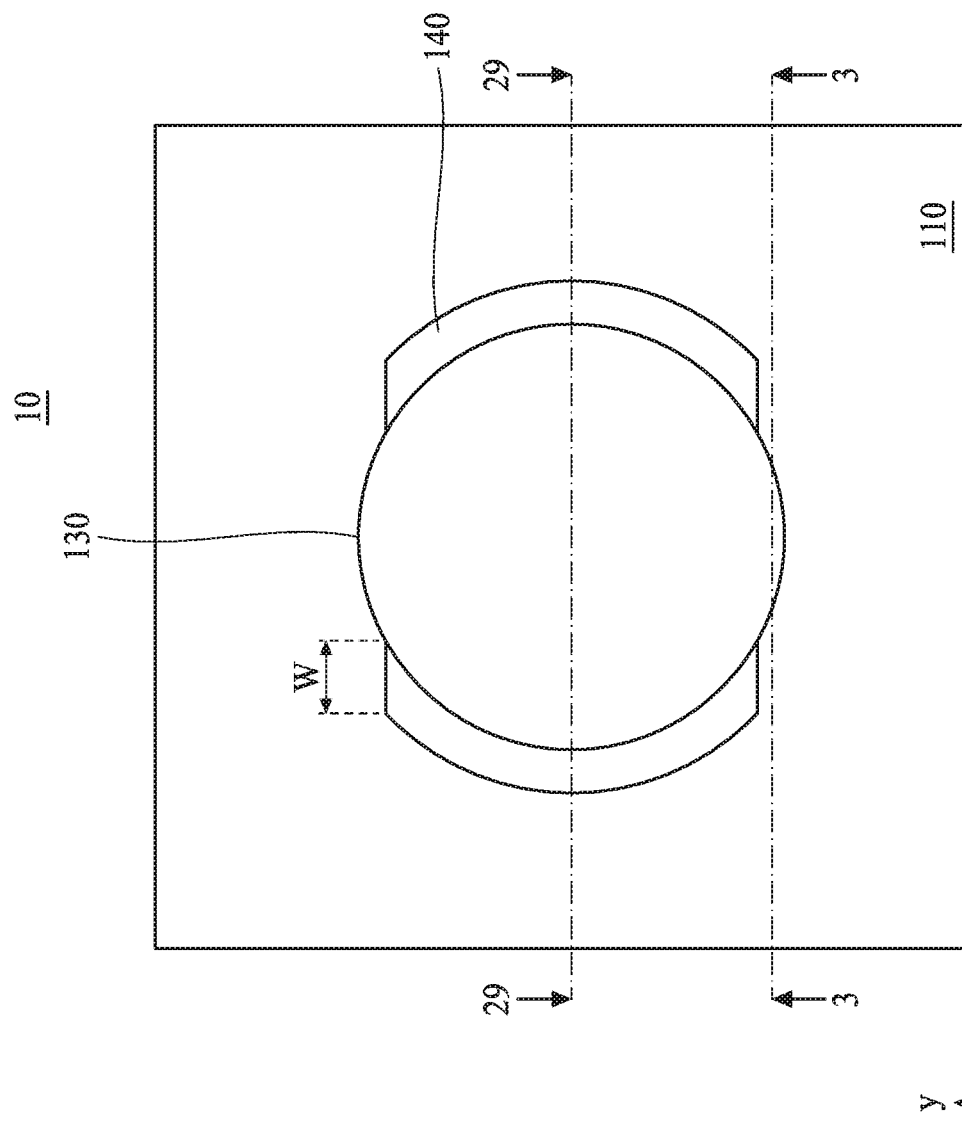
FIG. 28 is a top view of an intermediate stage in the formation of the semiconductor structure, in accordance with some embodiments of the present disclosure.
Figure 29:
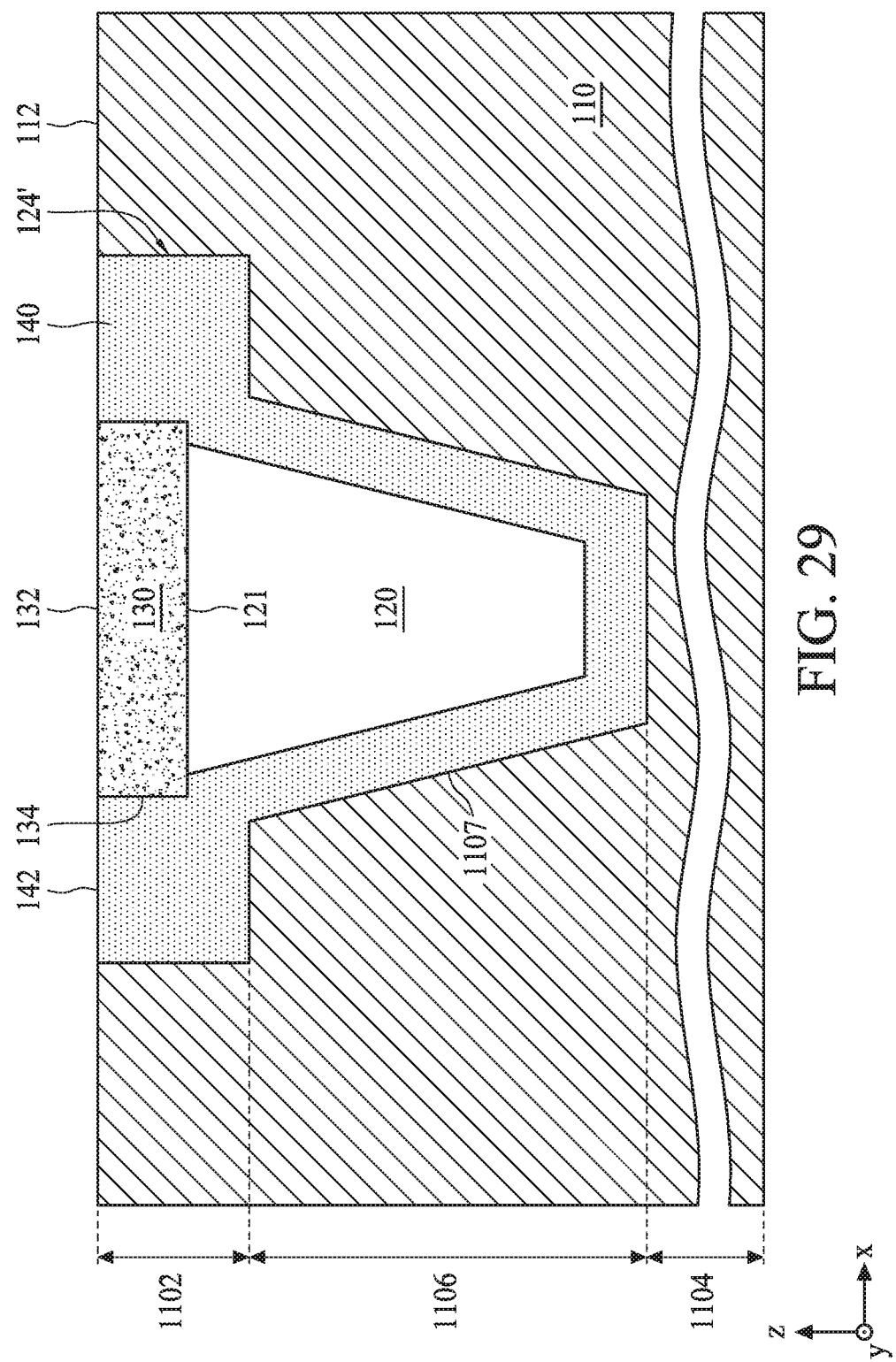
FIG. 29 is a cross-sectional view taken along the line 29-29 illustrated in FIG. 28.

Referring to FIGS. 28 and 29, in some embodiments, an isolating layer 140 is deposited to partially fill the stepped openings 124' according to a step 324 in FIG. 5. Accordingly, an air space region 120 is formed, and the semiconductor structure 10 shown in FIGS. 1 to 4 is completely formed. In some embodiments, the isolating layer 140 is connected to the capping layer 130 from opposite sides of the capping layer 130. In some embodiments, the isolating layer 140 has a uniform width W when viewed in a plan view. In some embodiments, the capping layer 130 includes a peripheral surface 134, and an area of a portion of the peripheral surface 134 interfacing with the isolating layer 140 is substantially greater than an area of a portion of the peripheral surface 134 interfacing with the semiconductor substrate 110. In some embodiments, the isolating layer 140 includes an upper surface 142 coplanar with the front surface 112. In some embodiments, the isolating layer 140 further extends to the sidewall 1107 of the middle portion 1106 and an upper surface 1105 of the bottom portion 1104. In some embodiments, a top boundary 121 of the air gap region 120, where the capping layer 130 is not in contact with the semiconductor substrate 110, is higher than an interface between the upper portion 1102 and the middle portion 1106. In some embodiments, the air gap region 120 is a dielectric with a dielectric constant of 1.

Figure 30:
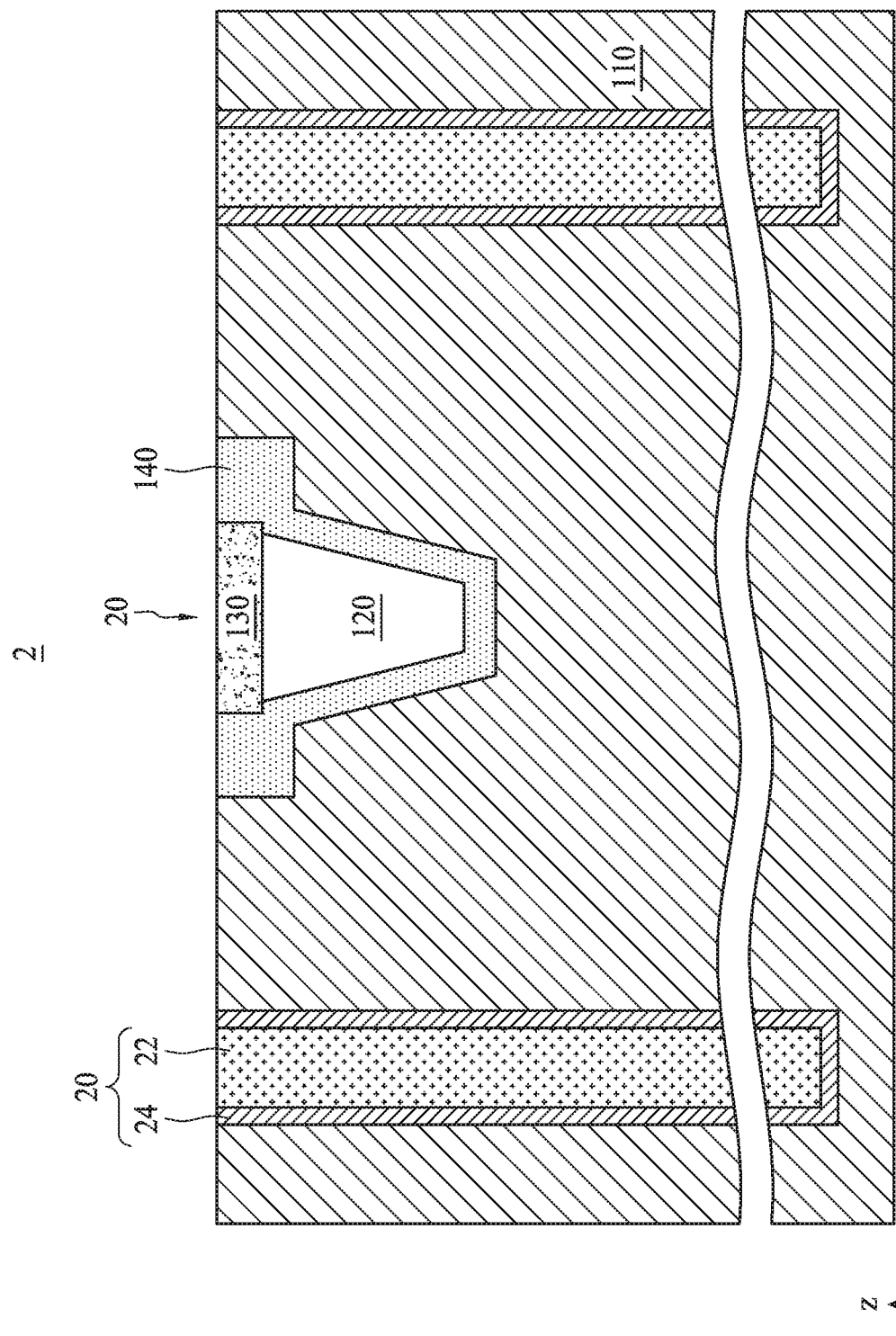
FIG. 30 is a cross-sectional view of a semiconductor device in accordance with some embodiments of the present disclosure.

In some embodiments, the semiconductor structure 10 of the present disclosure may be applied to, for example, a semiconductor device 2 including two or more through silicon vias 20, as shown in FIG. 30. In general, the semiconductor device 2 includes conductive structures 22 formed with insulating materials 24 provided between the semiconductor substrate 110 and the conductive structures 22. With high integration of the semiconductor device 2, a distance between the conductive structures 22 is gradually decreased. Accordingly, parasitic capacitance between the conductive structures 22 is increased. With the increase of parasitic capacitance, an operating speed of the semiconductor device 2 is reduced. With the semiconductor structure 10, the parasitic capacitance between the conductive structures 22 is reduced due to the relatively low dielectric constant of the air gap region 120. Therefore, the speed of the signal transmission through the through silicon vias 20 of the semiconductor structure according to the present disclosure is increased.

One aspect of the present disclosure provides a semiconductor structure. The semiconductor structure includes a semiconductor substrate, an air gap region, a capping layer, and an isolating layer. The air gap region is in the semiconductor substrate, the capping layer is on the air gap region, and the isolating layer is disposed in the semiconductor substrate and partially encircles the capping layer.

One aspect of the present disclosure provides a method of manufacturing a semiconductor structure, the method includes steps of providing a semiconductor substrate; forming a stepped opening in the semiconductor substrate; depositing a sacrificial material in the stepped opening, wherein a portion of the semiconductor substrate is exposed through the sacrificial material; depositing a capping layer on the sacrificial material and the semiconductor substrate; removing the sacrificial material; and depositing an isolating layer to partially fill the stepped opening.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:
1. A semiconductor structure, comprising:
a semiconductor substrate;
an air gap region in the semiconductor substrate;
a capping layer on the air gap region; and an isolating layer disposed in the semiconductor substrate and partially encircling the capping layer, wherein the capping layer includes a first peripheral surface interfacing with the isolating layer and a second peripheral surface interfacing with the semiconductor substrate, and the first peripheral surface and the second peripheral surface are located at a same level parallel to an upper surface of the capping layer and coupled to each other.

2. The semiconductor structure of claim 1, wherein the air gap region has a diameter that gradually decreases at positions of increasing distance from the capping layer.

3. The semiconductor structure of claim 1, wherein a portion of the capping layer is in contact with the semiconductor substrate.

4. The semiconductor structure of claim 1, wherein the semiconductor substrate is defined with a bottom portion, an upper portion where the capping layer is disposed, and a middle portion sandwiched between the bottom portion and the upper portion, and a top boundary of the air gap region, where the capping layer is not in contact with the semiconductor substrate, is higher than an interface between the upper portion and the middle portion.

5. The semiconductor structure of claim 4, wherein the upper portion has a height in a range between 10 and 15 μm, and the middle portion has a height in a range between 40 and 50 μm.

6. The semiconductor structure of claim 1, wherein the isolating layer is connected to the capping layer from opposite sides of the capping layer.

7. The semiconductor substrate of claim 1, wherein the isolating layer has a uniform width when viewed in a plan view.

8. The semiconductor structure of claim 1, wherein an area of a portion of the first peripheral surface interfacing with the isolating layer is greater than an area of a portion of the second peripheral surface interfacing with the semiconductor substrate.

* * * * *